(12) United States Patent
Bothe et al.

(10) Patent No.: US 12,464,759 B2
(45) Date of Patent: Nov. 4, 2025

(54) HIGH ELECTRON MOBILITY TRANSISTORS HAVING REDUCED DRAIN CURRENT DRIFT AND METHODS OF FABRICATING SUCH DEVICES

(71) Applicant: MACOM Technology Solutions Holdings, Inc., Lowell, MA (US)

(72) Inventors: Kyle Bothe, Cary, NC (US); Chris Hardiman, Cary, NC (US); Elizabeth Keenan, Cary, NC (US); Jia Guo, Apex, NC (US); Fabian Radulescu, Chapel Hill, NC (US); Scott Sheppard, Chapel Hill, NC (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 602 days.

(21) Appl. No.: 17/890,453

(22) Filed: Aug. 18, 2022

(65) Prior Publication Data

US 2024/0063300 A1   Feb. 22, 2024

(51) Int. Cl.
*H01L 23/498* (2006.01)
*H01L 23/00* (2006.01)
(Continued)

(52) U.S. Cl.
CPC ....... *H10D 30/475* (2025.01); *H10D 62/8503* (2025.01); *H10D 64/251* (2025.01); *H10D 30/015* (2025.01); *H10D 64/693* (2025.01)

(58) Field of Classification Search
CPC ......... H10D 30/015; H10D 30/47–485; H10D 64/693; H01L 21/8252; H01L 21/8258; H01L 27/0605; H01L 21/0217
See application file for complete search history.

(56) References Cited

U.S. PATENT DOCUMENTS 8,592,868 B2 * 11/2013 Heikman ........... H10D 30/4755
                                                           257/E29.246
9,991,360 B2 *  6/2018 Shealy .............. H01L 21/02145
(Continued)

FOREIGN PATENT DOCUMENTS

EP    2511949 A1   10/2012
EP    2879183 A1    6/2015
(Continued)

OTHER PUBLICATIONS

"Notification of Transmittal of the International Search Report and the Written Opinion of the International Searching Authority, or the Declaration for corresponding International Application No. PCT/US2023/071497, mailing date: Feb. 8, 2024 (24 pages)".

(Continued)

*Primary Examiner* — Wael M Fahmy
*Assistant Examiner* — Aneesa Riaz Baig
(74) *Attorney, Agent, or Firm* — Myers Bigel, P.A.

(57) ABSTRACT

A high electron mobility transistor comprises a semiconductor layer structure that includes a channel layer and a barrier layer and source and drain contacts on the semiconductor layer structure. A gate contact and a multi-layer passivation structure are provided on the semiconductor layer structure between the source contact and the drain contact. The multi-layer passivation structure comprises at least first and second silicon nitride layers that have different material compositions. A spacer passivation layer is provided on sidewalls of the first and second silicon nitride layers. A material composition of the spacer passivation layer is different than a material composition of at least one of the layers of the multi-layer passivation structure.

20 Claims, 11 Drawing Sheets

(51) Int. Cl.
  *H10D 1/60* (2025.01)
  *H10D 30/01* (2025.01)
  *H10D 30/47* (2025.01)
  *H10D 62/85* (2025.01)
  *H10D 64/23* (2025.01)
  *H10D 64/68* (2025.01)

(56) References Cited

U.S. PATENT DOCUMENTS

| | | | | |
|---|---|---|---|---|
| 10,276,703 | B2* | 4/2019 | Kamada | H10D 30/015 |
| 10,290,571 | B2* | 5/2019 | Yu | H01L 24/20 |
| 10,937,873 | B2 | 3/2021 | Lee et al. | |
| 11,335,798 | B2* | 5/2022 | Moens | H10D 64/685 |
| 2006/0102929 | A1* | 5/2006 | Okamoto | H10D 64/111 |
| | | | | 257/E29.127 |
| 2008/0290372 | A1 | 11/2008 | Makiyama | |
| 2010/0051896 | A1* | 3/2010 | Park | H10B 63/10 |
| | | | | 257/E47.001 |
| 2011/0147055 | A1* | 6/2011 | Ma | H01L 23/49822 |
| | | | | 29/830 |
| 2012/0043591 | A1* | 2/2012 | Takada | H10D 30/015 |
| | | | | 257/288 |
| 2012/0146728 | A1* | 6/2012 | Makiyama | H10D 64/513 |
| | | | | 257/E21.409 |
| 2012/0261720 | A1* | 10/2012 | Puglisi | H10D 30/015 |
| | | | | 257/E21.403 |
| 2013/0069251 | A1* | 3/2013 | Kunimoto | H05K 1/112 |
| | | | | 257/784 |
| 2013/0119555 | A1* | 5/2013 | Sundaram | H01L 23/15 |
| | | | | 257/774 |
| 2014/0002009 | A1* | 1/2014 | Choi | B60L 53/305 |
| | | | | 320/137 |
| 2014/0003009 | A1* | 1/2014 | Ma | H01L 21/486 |
| | | | | 174/262 |
| 2014/0073087 | A1* | 3/2014 | Huang | H01L 21/56 |
| | | | | 438/107 |
| 2014/0085846 | A1* | 3/2014 | Ma | H01L 23/15 |
| | | | | 156/247 |
| 2015/0091182 | A1* | 4/2015 | Chiu | H01L 24/19 |
| | | | | 438/126 |
| 2015/0145004 | A1* | 5/2015 | Inoue | H01L 23/3171 |
| | | | | 438/270 |
| 2015/0279815 | A1* | 10/2015 | Do | H01L 23/49827 |
| | | | | 257/737 |
| 2016/0315024 | A1* | 10/2016 | Lai | H01L 23/15 |
| 2016/0319626 | A1* | 11/2016 | Dille | F16L 15/04 |
| 2016/0338202 | A1* | 11/2016 | Park | H01L 24/00 |
| 2017/0170089 | A1* | 6/2017 | Donkers | H10D 8/051 |
| 2018/0197978 | A1* | 7/2018 | Matsuda | H10D 30/015 |
| 2018/0358456 | A1* | 12/2018 | Iucolano | H10D 64/511 |
| 2019/0057917 | A1* | 2/2019 | Tsai | H01L 21/565 |
| 2019/0088581 | A1* | 3/2019 | Yu | H01L 21/4857 |
| 2019/0237430 | A1* | 8/2019 | England | H01L 21/486 |
| 2019/0259843 | A1* | 8/2019 | Sugawara | H10D 30/475 |
| 2019/0326273 | A1* | 10/2019 | Bhagavat | H01L 23/49816 |
| 2020/0058592 | A1* | 2/2020 | Kim | H01L 21/4857 |
| 2020/0219987 | A1* | 7/2020 | Lee | H01L 21/02378 |
| 2021/0043750 | A1* | 2/2021 | Neufeld | H10D 62/8503 |
| 2021/0050251 | A1* | 2/2021 | Hsiao | H01L 24/83 |
| 2021/0111254 | A1* | 4/2021 | Jones | H10D 64/112 |
| 2021/0257486 | A1* | 8/2021 | Wong | H10D 64/01 |
| 2021/0384340 | A1* | 12/2021 | Ozaki | H10D 30/015 |
| 2022/0051972 | A1* | 2/2022 | Kim | H01L 23/49894 |
| 2022/0376085 | A1* | 11/2022 | Bothe | H10D 64/112 |
| 2022/0393006 | A1* | 12/2022 | Shindome | H10D 64/693 |
| 2022/0394858 | A1* | 12/2022 | Kamgaing | H01L 21/486 |
| 2023/0326981 | A1* | 10/2023 | Chen | H10D 62/8503 |
| | | | | 257/194 |
| 2023/0335596 | A1* | 10/2023 | Chen | H10D 30/015 |
| 2025/0048668 | A1* | 2/2025 | Meng | H10D 30/015 |

FOREIGN PATENT DOCUMENTS

| | | |
|---|---|---|
| EP | 3379578 A1 | 9/2018 |
| WO | 2010068554 A2 | 6/2010 |

OTHER PUBLICATIONS

Invitation to Pay Additional Fees and, Where Applicable, Protest Fee, for corresponding Application No. PCT/US2023/071497, dated Dec. 18, 2023, 17 pages.

* cited by examiner

HIGH ELECTRON MOBILITY TRANSISTORS HAVING REDUCED DRAIN CURRENT DRIFT AND METHODS OF FABRICATING SUCH DEVICES

FIELD

The inventive concepts described herein relate to semiconductor devices and, more particularly, to high electron mobility transistors.

BACKGROUND

Electronic devices formed in lower bandgap semiconductor materials such as silicon and gallium arsenide have found wide application in lower power and (in the case of silicon) lower frequency applications. These semiconductor materials may be less well suited for higher power and/or high frequency applications, however, because of their relatively small bandgaps (e.g., 1.12 eV for silicon and 1.42 eV for gallium arsenide at room temperature) and/or relatively small breakdown voltages.

For high power, high temperature and/or high frequency applications, devices formed in wider bandgap semiconductor materials such as silicon carbide (2.996 eV bandgap for alpha silicon carbide at room temperature) and the Group III nitrides (e.g., 3.36 eV bandgap for gallium nitride at room temperature) are often used. These materials, typically, have higher electric field breakdown strengths and higher electron saturation velocities as compared to gallium arsenide and silicon.

A device of particular interest for high power and/or high frequency applications is the High Electron Mobility Transistor (HEMT). A HEMT includes a semiconductor layer structure that has at least a channel layer and a barrier layer that have different material compositions and bandgap energies (with the bandgap of the channel layer being less than the bandgap of the barrier layer). When a HEMT is in its "on" or conducting state, a two-dimensional electron gas (2DEG) is formed at the heterojunction of the channel layer and the barrier layer. The channel layer (which is formed of the smaller bandgap material) has a higher electron affinity. The 2DEG is an accumulation layer in the smaller bandgap material and can contain a very high sheet electron concentration. Additionally, electrons that originate in the wider-bandgap barrier layer transfer to the 2DEG layer, allowing a high electron mobility due to reduced ionized impurity scattering. This combination of high carrier concentration and high carrier mobility can give the HEMT a very large transconductance and may provide a strong performance advantage over metal oxide semiconductor field effect transistors (MOSFETs) for high-frequency applications.

High electron mobility transistors fabricated in Group III-nitride based material systems have the potential to generate large amounts of radio frequency (RF) power because of the combination of material characteristics that includes the aforementioned high breakdown fields, wide bandgaps, large conduction band offset, and/or high saturated electron drift velocity. As used herein, the term "Group III-nitride" refers to those semiconducting compounds formed between nitrogen (N) and the elements in Group III of the periodic table, usually aluminum (Al), gallium (Ga), and/or indium (In). The term also refers to ternary and quaternary (or higher) compounds such as, for example, AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements.

FIG. 1A is a schematic plan view of a conventional gallium nitride based high electron mobility transistor 100, while FIG. 1B is a schematic cross-sectional view of the high electron mobility transistor 100 taken along line 1B-1B of FIG. 1A. As shown in FIGS. 1A-1B, the high electron mobility transistor 100 may be formed on a substrate 110 such as, for example, a silicon carbide substrate. An optional buffer layer 120 may be formed on the substrate 110, and a channel layer 130 is formed on the buffer layer 120 opposite the substrate 110. A barrier layer 140 is formed on the channel layer 130 opposite the substrate 110. Herein, when a first layer is referred to as being on a second layer "opposite" a third layer, this means that the second layer is in between the first and third layers. Thus, the buffer layer 120 is in between the channel layer 130 and the substrate 110. The channel layer 130 and the barrier layer 140 may include Group III-nitride based materials, where the channel layer 130 has a bandgap that is less than a bandgap of the barrier layer 140. The substrate 110, buffer layer 120, channel layer 130 and barrier layer 140 may together form a semiconductor layer structure 102. A source contact 150 and a drain contact 152 are formed on an upper surface of the barrier layer 140 and are laterally spaced apart from each other. A gate contact 154 is formed on the upper surface of the barrier layer 140 between the source contact 150 and the drain contact 152. A passivation layer 160 covers the exposed portions of the top surface of the barrier layer 140. A field plate 156 is formed on the passivation layer 160 between the drain contact 152 and the gate contact 154. The field plate 156 may be electrically connected to the source contact 150 via source contact extensions 151. A 2DEG layer 132 is formed at a junction between the channel layer 130 and the barrier layer 140 when the HEMT device 100 is biased to be in its conducting or "on" state. The 2DEG layer 132 acts as a highly conductive layer that allows current to flow between the source and drain regions of the device that are beneath the source contact 150 the drain contact 152, respectively.

SUMMARY

Pursuant to some embodiments of the present invention, high electron mobility transistors are provided that comprise a semiconductor layer structure that includes a channel layer and a barrier layer on the channel layer, a source contact on the semiconductor layer structure, a drain contact on the semiconductor layer structure, a gate contact on the semiconductor layer structure between the source contact and the drain contact, a multi-layer passivation structure on the semiconductor layer structure between the source contact and the drain contact, the multi-layer passivation structure including a plurality of layers that include at least a first silicon nitride layer and a second silicon nitride layer that has a material composition that is different than a material composition of the first silicon nitride layer, and a spacer passivation layer on sidewalls of both the first silicon nitride layer and the second silicon nitride layer. A material composition of the spacer passivation layer is different than a material composition of at least one of the layers of the multi-layer passivation structure.

In some embodiments, the first silicon nitride layer directly contacts the barrier layer and the second silicon nitride layer is on the first silicon nitride layer opposite the barrier layer, where the second silicon nitride layer is more silicon-rich than the first silicon nitride layer.

In some embodiments, the multi-layer passivation structure further comprises a third silicon nitride layer on the second silicon nitride layer opposite the first silicon nitride layer, where the third silicon nitride layer is more silicon-rich than the first silicon nitride layer.

In some embodiments, the spacer passivation layer comprises a silicon-rich silicon nitride layer that is more silicon-rich than all three of the first silicon nitride layer, the second silicon nitride layer, and the third silicon nitride layer.

In some embodiments, the spacer passivation layer directly contacts sidewalls of all three of the first through third silicon nitride layers.

In some embodiments, the spacer passivation layer comprises a silicon-rich silicon nitride layer.

In some embodiments, the spacer passivation layer is in between the multi-layer passivation structure and the gate contact.

In some embodiments, the spacer passivation layer directly contacts both the multi-layer passivation structure and the gate contact.

In some embodiments, the spacer passivation layer comprises an inner side that faces the multi-layer passivation structure and an outer side that is opposite the inner side, the outer side having a concave profile.

In some embodiments, the spacer passivation layer has a generally triangular shape with the longest side thereof having a concave profile.

In some embodiments, a longitudinal axis of the gate contact extends on the barrier layer in a first direction, the multi-layer passivation structure extends on the barrier layer a first distance in a second direction that is perpendicular to the first direction, and the spacer passivation layer extends on the barrier layer a second distance in the second direction that is less than 5 percent the first length.

In some embodiments, a quiescent drain current of the high electron mobility transistor is within 10 percent of a peak drain current of the high electron mobility transistor.

In some embodiments, the spacer passivation layer comprises a fourth silicon nitride layer and a fifth silicon nitride layer that is between the fourth silicon nitride layer and the multi-layer passivation structure.

In some embodiments, the fourth silicon nitride layer and the fifth silicon nitride layer are each more silicon-rich than all three of the first silicon nitride layer, the second silicon nitride layer, and the third silicon nitride layer.

In some embodiments, the fifth silicon nitride layer is an L-shaped layer that directly contacts a sidewall of the multi-layer passivation structure.

Pursuant to further embodiments of the present invention, high electron mobility transistors are provided that comprise a semiconductor layer structure that includes a channel layer and a barrier layer on the channel layer, a source contact on the semiconductor layer structure, a drain contact on the semiconductor layer structure, a gate contact on the semiconductor layer structure between the source contact and the drain contact, a passivation structure on the semiconductor layer structure between the source contact and the drain contact, and a spacer passivation layer on a sidewall of the passivation layer, where an outer side of the spacer passivation layer that is opposite the passivation layer has a concave profile.

In some embodiments, the passivation structure comprises a multi-layer passivation structure that includes at least a first silicon nitride layer that directly contacts the barrier layer and a second silicon nitride layer that is on the first silicon nitride layer opposite the barrier layer, where the second silicon nitride layer has a material composition that is different than a material composition of the first silicon nitride layer.

In some embodiments, the second silicon nitride layer is more silicon-rich than the first silicon nitride layer.

In some embodiments, the multi-layer passivation structure further comprises a third silicon nitride layer on the second silicon nitride layer opposite the first silicon nitride layer, where the third silicon nitride layer is more silicon-rich than the first silicon nitride layer.

In some embodiments, the spacer passivation layer directly contacts sidewalls of all three of the first through third silicon nitride layers.

In some embodiments, the spacer passivation layer comprises a silicon-rich silicon nitride layer that is more silicon-rich than the first silicon nitride layer.

In some embodiments, the spacer passivation layer is in between the multi-layer passivation structure and the gate contact.

In some embodiments, the spacer passivation layer directly contacts both the multi-layer passivation structure and the gate contact.

In some embodiments, a longitudinal axis of the gate contact extends on the barrier layer in a first direction, the multi-layer passivation structure extends on the barrier layer a first distance in a second direction that is perpendicular to the first direction, and the spacer passivation layer extends on the barrier layer a second distance in the second direction that is less than 5 percent the first length.

In some embodiments, a quiescent drain current of the high electron mobility transistor is within 10 percent of a peak drain current of the high electron mobility transistor.

In some embodiments, the spacer passivation layer comprises a fourth silicon nitride layer and a fifth silicon nitride layer that is between the fourth silicon nitride layer and the multi-layer passivation structure.

In some embodiments, the fourth silicon nitride layer and the fifth silicon nitride layer are each more silicon-rich than all three of the first silicon nitride layer, the second silicon nitride layer, and the third silicon nitride layer.

In some embodiments, the fifth silicon nitride layer is an L-shaped layer that directly contacts a sidewall of the multi-layer passivation structure.

Pursuant to additional embodiments of the present invention, high electron mobility transistors are provided that comprise a semiconductor layer structure that includes a channel layer and a barrier layer on the channel layer, a source contact on the semiconductor layer structure, a drain contact on the semiconductor layer structure, a gate contact on the semiconductor layer structure between the source contact and the drain contact, a multi-layer passivation structure on the semiconductor layer structure between the source contact and the drain contact, the multi-layer passivation structure comprising a first silicon nitride layer that directly contacts the semiconductor layer structure, and a silicon nitride spacer passivation layer that includes at least one silicon nitride layer on a sidewall of the multi-layer passivation structure, wherein a silicon concentration of the at least one silicon nitride layer exceeds a silicon concentration of the first silicon nitride layer.

In some embodiments, the spacer passivation layer is positioned between the first silicon nitride layer and the gate contact so that the first silicon nitride layer does not contact the gate contact.

In some embodiments, the multi-layer passivation structure further comprises a second silicon nitride layer that is on the first silicon nitride layer opposite the barrier layer, where the second silicon nitride layer is more silicon-rich than the first silicon nitride layer.

In some embodiments, the multi-layer passivation structure further comprises a third silicon nitride layer on the second silicon nitride layer opposite the first silicon nitride layer, where the third silicon nitride layer is more silicon-rich than the first silicon nitride layer.

In some embodiments, the spacer passivation layer comprises a silicon-rich silicon nitride layer that is more silicon-rich than all three of the first silicon nitride layer, the second silicon nitride layer, and the third silicon nitride layer.

In some embodiments, the spacer passivation layer directly contacts sidewalls of all three of the first through third silicon nitride layers.

In some embodiments, the spacer passivation layer directly contacts both the multi-layer passivation structure and the gate contact.

In some embodiments, an outer side of the spacer passivation layer that is opposite the multi-layer passivation structure has a concave profile.

In some embodiments, the spacer passivation layer has a generally triangular shape with the longest side thereof having a concave profile.

In some embodiments, a longitudinal axis of the gate contact extends on the barrier layer in a first direction, the multi-layer passivation structure extends on the barrier layer a first distance in a second direction that is perpendicular to the first direction, and the spacer passivation layer extends on the barrier layer a second distance in the second direction that is less than 5 percent the first length.

In some embodiments, a quiescent drain current of the high electron mobility transistor is within 10 percent of a peak drain current of the high electron mobility transistor.

Pursuant to still further embodiments of the present invention, methods of fabricating a high electron mobility transistor are provided. Pursuant to these methods, a semiconductor layer structure is provided that includes a channel layer and a barrier layer on the channel layer. A first silicon nitride layer of a multi-layer passivation structure is formed on the semiconductor layer structure. An opening for a gate contact is patterned in the multi-layer passivation structure. A passivation layer is formed in the opening. The passivation layer is removed from the bottom of the opening while allowing portions of the passivation layer to remain on first and second opposed sidewalls of the opening so that the remaining portions of the passivation layer form respective first and second spacer passivation layers.

In some embodiments, the method further comprises forming a second silicon nitride layer of the multi-layer passivation structure on the first silicon nitride layer, and wherein patterning the opening for the gate contact in the multi-layer passivation structure comprises patterning an opening that extends through at least the first silicon nitride layer and the second silicon nitride layer.

In some embodiments, the second silicon nitride layer is more silicon-rich than the first silicon nitride layer.

In some embodiments, the method further comprises forming a third silicon nitride layer of the multi-layer passivation structure on the second silicon nitride layer, wherein patterning the opening for the gate contact in the multi-layer passivation structure comprises patterning an opening that extends through at least the first through third silicon nitride layers.

In some embodiments, the method further comprises patterning openings for a source contact and a drain contact in both the first silicon nitride layer and the second silicon nitride layer prior to forming the third silicon nitride layer.

In some embodiments, the first silicon nitride layer directly contacts the barrier layer and the second silicon nitride layer is on the first silicon nitride layer opposite the barrier layer, and the second silicon nitride layer is more silicon-rich than the first silicon nitride layer.

In some embodiments, the first spacer passivation layer comprises a silicon-rich silicon nitride layer that is more silicon-rich than all three of the first silicon nitride layer, the second silicon nitride layer, and the third silicon nitride layer.

In some embodiments, the first spacer passivation layer directly contacts sidewalls of all three of the first through third silicon nitride layers.

In some embodiments, the method further comprises forming a gate contact in the opening, where the first spacer passivation layer is in between the multi-layer passivation structure and the gate contact.

In some embodiments, an outer side of the first spacer passivation layer that is opposite the multi-layer passivation structure has a concave profile.

Figure 1A:
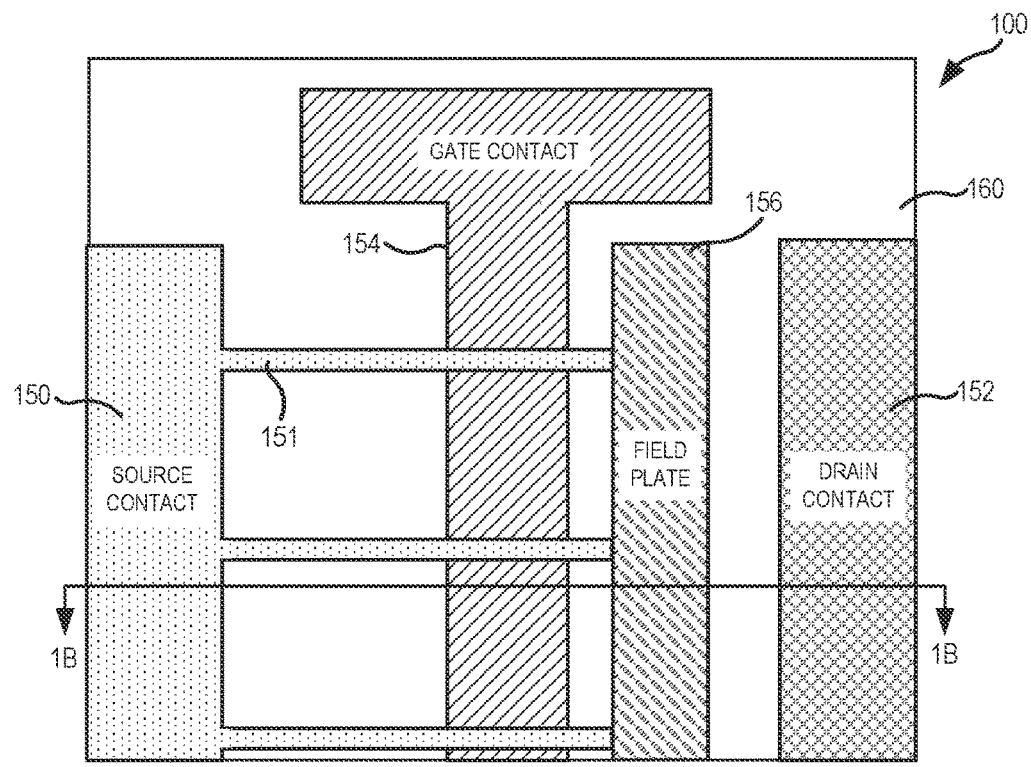
FIG. 1A is a schematic plan view of a conventional HEMT.

It should be noted that the dimensions of various elements in the drawings (e.g., the thickness of layers and the lateral and longitudinal widths of elements/layers) are not necessarily drawn to scale in the figures, and various elements may be greatly enlarged relative to other elements in some drawings to better show details of those elements.

DETAILED DESCRIPTION

Embodiments of the present invention are directed to HEMTs that may exhibit reduced drain current drift.

Figure 1B:
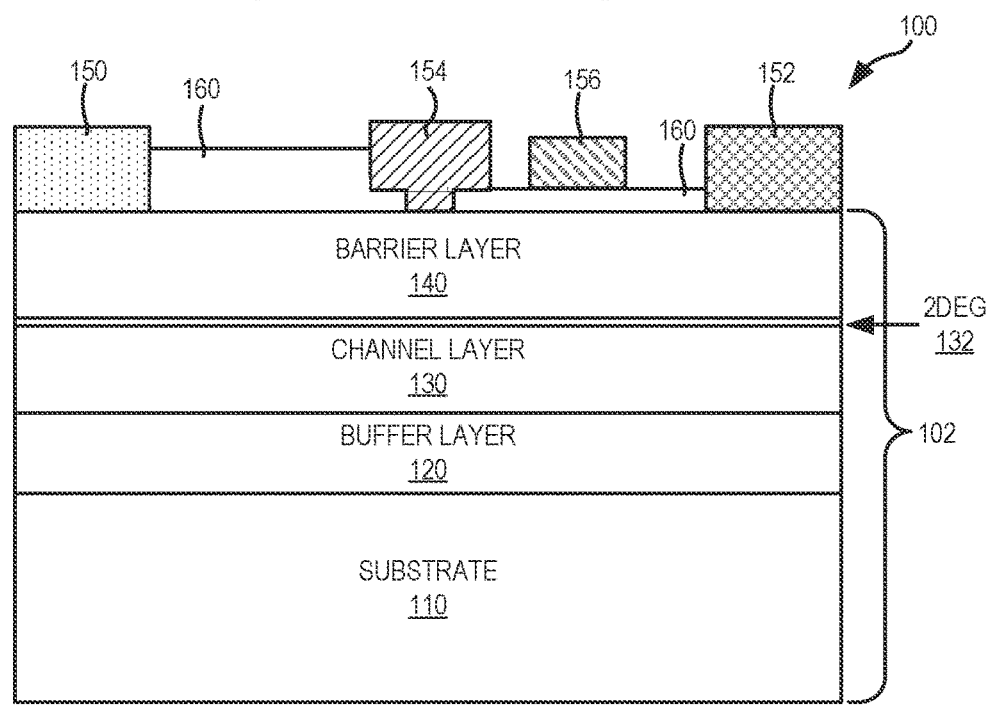
FIG. 1B is a schematic cross-sectional view taken along line 1B-1B of FIG. 1A.
Figure 2:
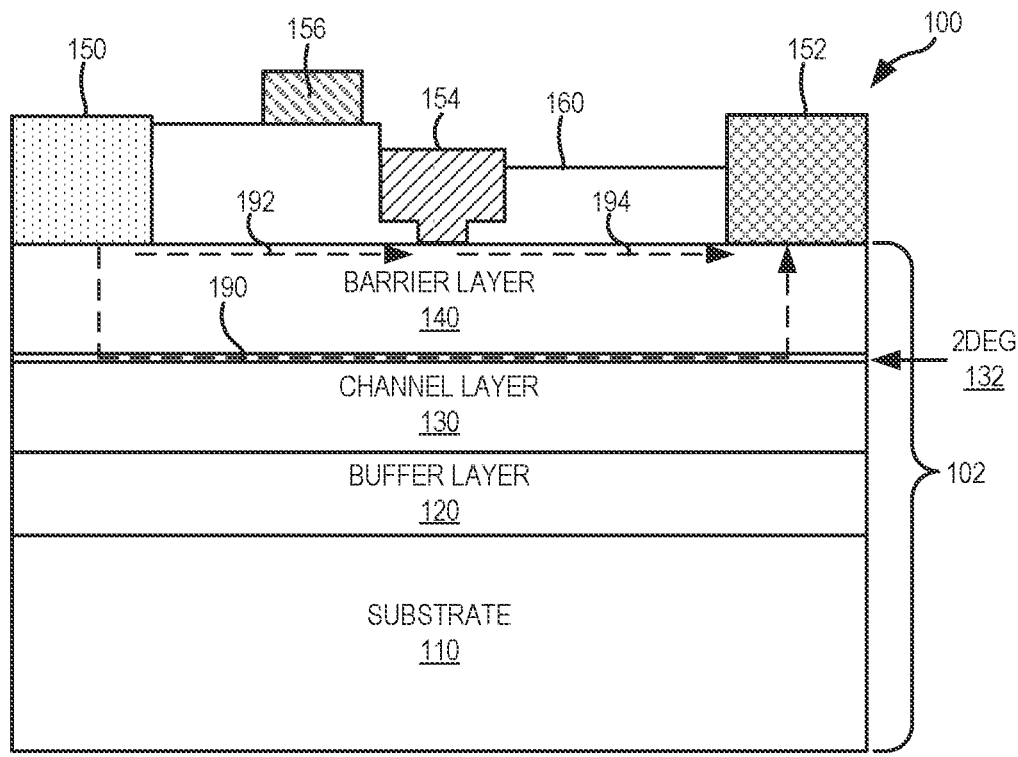
FIG. 2 is the cross-sectional view of FIG. 1B with various current paths identified thereon.

FIG. 2 is the cross-sectional view of FIG. 1B with various current paths illustrated thereon. As shown in FIG. 2, the primary on-state conduction path in a HEMT is the conduction path 190 that is formed in the 2DEG layer 132 that allows a drain-to-source current IDS to flow between the source contact 150 and the drain contact 152. However, as is also shown in FIG. 2, additional current paths may exist in the conventional HEMT 100. These additional current paths include a current path 192 between the source contact 150 and the gate contact 154 along the interface between the semiconductor layer structure 102 and the passivation layer 160 and a current path 194 between the gate contact 154 and the drain contact 152 along the interface between the semiconductor layer structure 102 and the passivation layer 160. The current paths 192 and 194 impact the gate leakage current IG and the drain leakage current ID of the device. The additional current paths 192, 194 that are illustrated in FIG. 2 are generally undesirable current paths.

The HEMT 100 may be configured as a normally-on HEMT or as a normally-off HEMT. A normally-off HEMT is configured so that when the source and drain contacts 150, 152 are appropriately biased and no bias voltage is applied to the gate contact 154, the device will not conduct current between the drain and source contacts 150, 152. In contrast, a normally-on HEMT is configured so that when the drain and source contacts 150, 152 are appropriately biased and no bias voltage is applied to the gate contact 154, the device will conduct current between the source and drain contacts 150, 152. Thus, in other words, a normally-off HEMT may be turned on (i.e., made conducting) by applying a bias voltage to the gate contact 154, while a normally-on HEMT may be turned off (i.e., made non-conducting) by applying a bias voltage to the gate contact 154. The discussion below will assume that the HEMT 100 is a normally-on HEMT, although embodiments of the present invention are not limited thereto Unfortunately, charges may build up in the semiconductor layer structure 102 due to, for example, defects in the upper surface of the semiconductor layer structure 102 that act as electron traps. This charge build-up may result in the accumulation of charge in the semiconductor layer structure 102 that can reduce current flow when the HEMT 100 switches from the off-state to the on-state, which is referred to as RF dispersion. This behavior, in turn, may generate non-linearities when the HEMT 100 is used as a transistor amplifier, and these non-linearities may give rise to passive intermodulation (PIM) distortion. As is known in the art, PIM distortion refers to the generation of unwanted intermodulation products along the transmit path of a communications system that may degrade the performance of the receive path of the communications system. The drain current drift performance of a HEMT is a measure of the degree to which the drain current varies due to, for example, charge build-up, during the time period from when the HEMT turns on until the drain current reaches steady state conditions.

Pursuant to embodiments of the present invention, HEMTs are provided that may have improved drain current drift performance and/or improved gate and drain leakage current performance. The HEMTs may be gallium nitride based devices or other Group III-nitride based devices. Without intending to be bound by any particular theory of operation, it is believed that defects along or near the upper surface of the semiconductor layer structure 102 (defects in such locations are referred to herein as defects "at" the upper surface of the semiconductor layer structure) may form electron traps that capture charges during operation of the HEMT. These trapped charges may collect at the interface between the passivation layer 160 and the barrier layer 140 in the regions between the source contact 150 and the gate contact 154 and between the gate contact 154 and the drain contact 152, and these trapped charges may reduce current flow through the 2DEG layer 132. The HEMTs according to embodiments of the present invention may include features that reduce formation of charges in the above-described electron traps and/or dissipate charges that are caught in these electron traps. As a result, the drain current drift performance of the HEMTs according to embodiments of the present invention may exhibit significantly improved drain current drift performance, and hence may exhibit improved PIM distortion performance.

The HEMTs according to embodiments of the present invention may comprise a semiconductor layer structure that includes a channel layer and a barrier layer on the channel layer. The HEMTs further include source, drain and gate contacts that are formed on an upper surface of the semiconductor layer structure, with the gate contact between the source and drain contacts. A first multi-layer passivation structure is formed on the upper surface of the semiconductor layer structure between the gate contact and the source contact and a second multi-layer passivation structure is formed on the upper surface of the semiconductor layer structure between the gate contact and the drain contact. A respective spacer passivation layer is formed on the sidewall of each multi-layer passivation structure to face the gate contact. The spacer passivation layers may separate each multi-layer passivation structure from the gate contact. Each spacer passivation layer may comprise a silicon nitride layer. In some embodiments, the spacer passivation layer may be a multi-layer structure (e.g., may include two silicon nitride layers).

Each multi-layer passivation structure may comprise at least a first silicon nitride layer that directly contacts the semiconductor layer structure and a second silicon nitride layer that is on the first silicon nitride layer opposite the semiconductor layer structure. Each multi-layer passivation structure may further comprise a third silicon nitride layer that is on the second silicon nitride layer opposite the first silicon nitride layer. The first through third silicon nitride layers of each multi-layer passivation structure may thus be stacked in the "vertical" direction, which refers to the direction that extends perpendicular to the major (top and bottom) surfaces of the semiconductor layer structure.

A material composition of the second silicon nitride layer may be different than a material composition of the first silicon nitride layer. For example, the second silicon nitride layer may be more silicon-rich than the first silicon nitride layer. The third silicon nitride layer may also be more silicon-rich than the first silicon nitride layer. A material composition of the spacer passivation layer may be different than a material composition of at least the first silicon nitride layer. For example, the spacer passivation layer may be more silicon-rich than the first silicon nitride layer. In some embodiments, the spacer passivation layer may be more silicon-rich than all three of the first through third silicon nitride layers. The spacer passivation layer may directly contact sidewalls of all three of the first through third silicon nitride layers.

In some embodiments, the spacer passivation layer may include a first side that contacts the multi-layer passivation structure, a second side that contacts the semiconductor layer structure, and a third side that contacts the gate contact. The third side may be a longest side in some embodiments. The third side may have a generally concave shape in some embodiments. In some embodiments, the spacer passivation layer may have a generally triangular shape, except that the longest side of the triangle has a concave profile.

The HEMTs according to embodiments of the present invention may exhibit significantly improved drain current drift performance. The drain current in conventional HEMTs typically drops by at least 25% from its initial value to its quiescent (steady-state) value. The HEMTs according to embodiments of the present invention may have quiescent drain current values that are within 10%, or within 5%, or even within 3% of the initial drain current values. The positions of the spacer passivation layers, the thickness of the multi-layer passivation structure, the materials of the multi-layer passivation structure and of the spacer passivation layer, and/or the shape of the spacer passivation layer may contribute to the improved drain current drift performance.

Embodiments of the present invention will now be described in greater detail with reference to FIGS. 3A-8.

Figure 3A:
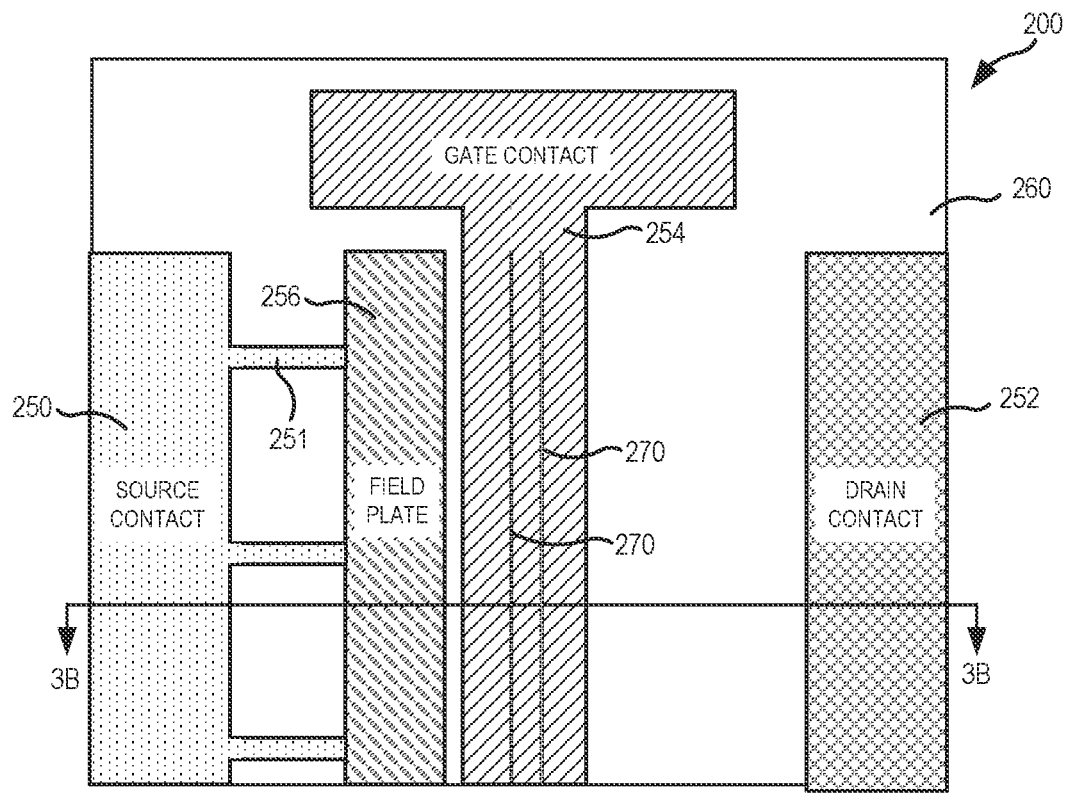
FIG. 3A is a schematic plan view of a HEMT according to embodiments of the present invention.
Figure 3B:
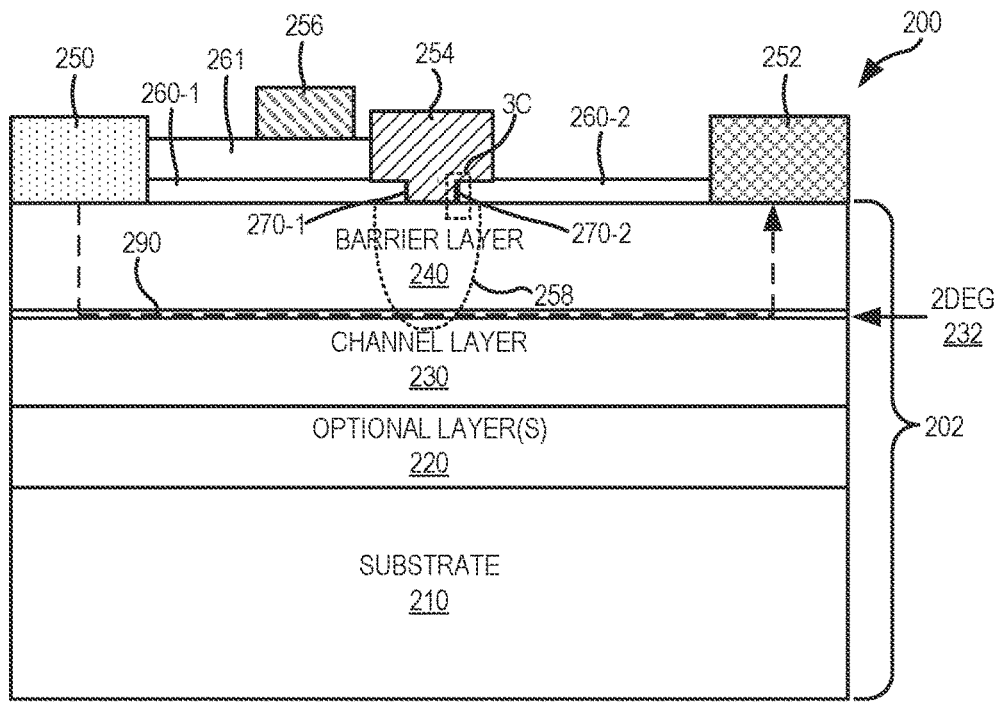
FIG. 3B is a schematic cross-sectional view taken along line 3B-3B of FIG. 3A.
Figure 3C:
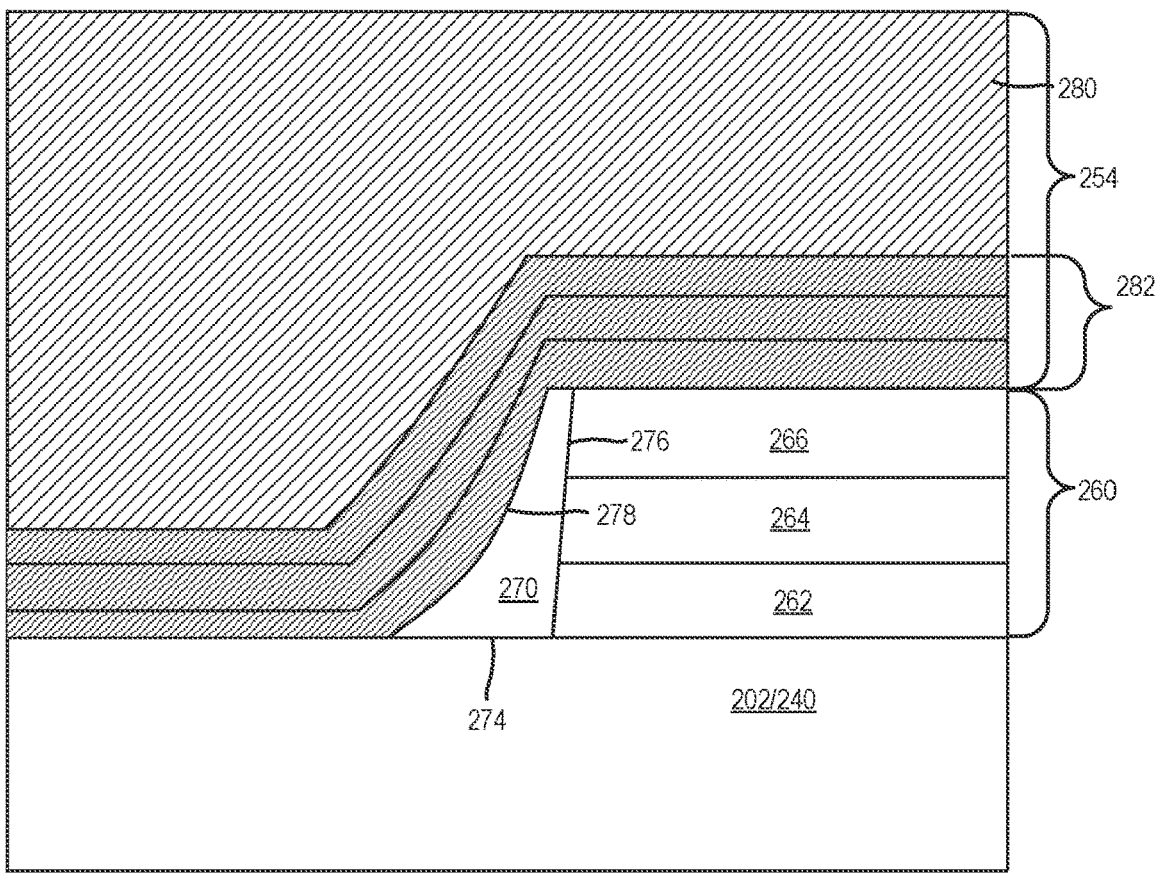
FIG. 3C is a greatly enlarged view of a small portion of FIG. 3B.

FIG. 3A is a schematic plan view of a gallium nitride based HEMT 200 according to embodiments of the present invention, and FIG. 3B is a schematic cross-sectional view of the HEMT 200 taken along line 3B-3B of FIG. 3A. FIG. 3C is a greatly enlarged view of the portion "3C" of FIG. 3B.

As shown in FIGS. 3A-3B, the HEMT 200 may be formed on a substrate 210. The substrate 210 may comprise, for example, a semi-insulating silicon carbide substrate that may be, for example, a 4H polytype or a 6H polytype of silicon carbide. Other silicon carbide candidate polytypes that may be used to form the substrate 210 include the 3C, 6H, and 15R polytypes. The term "semi-insulating" is used descriptively rather than in an absolute sense. In particular embodiments of the present invention, the silicon carbide bulk crystal has a resistivity equal to or higher than about $1 \times 10^5$ Ω-cm at room temperature. Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like. The substrate 210 may be a silicon carbide wafer, and the HEMT 200 may be formed, at least in part, via wafer-level processing, and the wafer may then be diced to provide a plurality of individual HEMTs 200.

One or more optional layers 220 such as, for example, buffer, nucleation and/or transition layers, may be formed on an upper surface of the substrate 210. For example, an aluminum nitride (AlN) buffer layer 220 may be formed on the upper surface of the substrate 210 to provide an appropriate crystal structure transition between the silicon carbide substrate 210 and the remainder of the device 200. Additionally, strain balancing transition layer(s) 220 may also and/or alternatively be provided as described, for example, in commonly assigned U.S. Patent Publication No. 2003/0102482 A1, the disclosure of which is incorporated herein by reference as if set forth fully herein. The optional layers 220 may be deposited by metal organic chemical vapor deposition (MOCVD) or by other techniques known to those of skill in the art, such as molecular beam epitaxy (MBE) or high vapor pressure epitaxy (HYPE).

A channel layer 230 is formed on the upper surface of the substrate 210 (or on the optional layers 220), and a barrier layer 240 is formed on an upper surface of the channel layer 230. The channel layer 230 may have a bandgap that is less than the bandgap of the barrier layer 240 and the channel layer 230 may also have a larger electron affinity than the barrier layer 240. The channel layer 230 and the barrier layer 240 may include Group III-nitride based materials.

In some embodiments, the channel layer 230 may be a Group III nitride, such as $Al_xGa_{1-x}N$, where 0≤x<1, provided that the energy of the conduction band edge of the channel layer 230 is less than the energy of the conduction band edge of the barrier layer 240 at the interface between the channel and barrier layers 230, 240. In certain embodiments of the present invention, x=0, indicating that the channel layer 230 is GaN. The channel layer 230 may also be other Group III-nitrides such as InGaN, AlInGaN or the like. The channel layer 230 may be undoped ("unintentionally doped") and may be grown to a thickness of greater than about 20 Å. The channel layer 230 may also be a multi-layer structure, such as a superlattice or combinations of GaN, AlGaN or the like. The channel layer 230 may be under compressive strain in some embodiments.

In some embodiments, the barrier layer 240 is AN, AlInN, AlGaN or AlInGaN or combinations of layers thereof. The barrier layer 240 may comprise a single layer or may be a multi-layer structure. In particular embodiments of the present invention, the barrier layer 240 may be thick enough and may have a high enough aluminum (Al) composition and doping to induce a significant carrier concentration at the interface between the channel layer 230 and the barrier layer 240 through polarization effects when the barrier layer 240 is buried under ohmic contact metal. The barrier layer 240 may, for example, be from about 0.1 nm to about 30 nm thick, but is not so thick as to cause cracking or substantial defect formation therein. Barrier layer thicknesses in the range of 15-30 nm are common. In certain embodiments, the barrier layer 240 is undoped or doped with an n-type dopant to a concentration less than about $10^{19}$ cm$^{-3}$. In some embodiments of the present invention, the barrier layer 240 is $Al_xGa_{1-x}N$ where 0<x<1. In particular embodiments, the aluminum concentration is about 25%. However, in other embodiments of the present invention, the barrier layer 240 comprises AlGaN with an aluminum concentration of between about 5% and about 100%. In specific embodiments of the present invention, the aluminum concentration is greater than about 10%. The channel layer 230 and/or the barrier layer 240 may be deposited, for example, by MOCVD, MBE or HYPE. During on-state operation, a 2DEG layer 232 is induced in the channel layer 230 at a junction between the channel layer 230 and the barrier layer 240. The 2DEG layer 232 acts as a highly conductive layer that allows conduction between the source and drain regions of the device that are beneath the source contact 250 the drain contact 252, respectively. The substrate 210, the buffer/nucleation/transition layer(s) 220, the channel layer 230 and the barrier layer 240 form a semiconductor layer structure 202.

A source contact 250 and a drain contact 252 are formed on an upper surface of the barrier layer 240 and are laterally spaced apart from each other. A gate contact 254 is formed on the upper surface of the barrier layer 240 between the source contact 250 and the drain contact 252. The material of the gate contact 254 may be chosen based on the composition of the barrier layer 240. Conventional materials capable of making a Schottky contact to a gallium nitride based semiconductor material may be used, such as, for example, Ni, Pt, NiSi$_x$, Cu, Pd, Cr, W and/or WSiN. The source contact 250 and the drain contact 252 may include a metal, such as TiAlN, that can form an ohmic contact to a gallium nitride based semiconductor material.

A pair of multi-layer passivation structures 260 (or one large multi-layer passivation structure 260) are formed on the upper surface of the barrier layer 240, with the first multi-layer passivation structure 260-1 formed between the source contact 250 and the gate contact 254, and the second multi-layer passivation structure 260-2 formed between the drain contact 252 and the gate contact 254. Respective spacer passivation layers 270 (see FIG. 3C) are formed on the sidewalls of each multi-layer passivation structure 260 that face the gate contact 254. An additional passivation layer 261 is formed on the first multi-layer passivation structure 260-1. A field plate 256 is formed on the additional passivation layer 261 between the source contact 250 and the gate contact 254. As shown in FIG. 3A, the field plate 256 may be electrically connected to the source contact 250 via source contact extensions 251. The additional passivation layer 261 is provided to space the field plate 256 an appropriate distance above the semiconductor layer structure 202. The multi-layer passivation structure 260 and the spacer passivation layer 270 will be discussed in further detail below.

As discussed above, a HEMT may be configured as a normally-on HEMT or as a normally-off HEMT. The discussion below will assume that the HEMT 200 is a normally-on HEMT, although embodiments of the present invention are not limited thereto.

As shown by the arrow labelled 290 in FIG. 3B, when no bias voltage is applied to the gate contact 254 (and the source and drain contacts 250, 252 have suitable bias voltages applied thereto), electrons will flow downwardly through the barrier layer 240 underneath the source contact 250 to the 2DEG layer 232, and then will flow laterally along the 2DEG layer 232 to the portion of the semiconductor layer structure 202 underneath the drain contact 252, and will then flow upwardly into the drain contact 252. When a sufficient bias voltage is applied to the gate contact 254, however, a region in the semiconductor material underneath the gate contact 254 will be depleted of charge carriers. The depletion region is shown in FIG. 3B as a region 258 that is defined by a dotted curve, with the size of the depletion region 258 being a function of, among other things, the applied gate bias voltage. The absence of charge carriers in the depletion region 258 effectively blocks electron flow through the 2DEG layer 232, and hence the application of the gate bias voltage turns off the HEMT 200.

However, as discussed above with reference to FIGS. 1A-1B, there are various current paths other than the current path 290 through the HEMT 200, including a gate leakage current IG path (see 192 in FIG. 2) and a drain leakage current ID path (see 194 in FIG. 2). The gate and drain leakage current paths may allow current flow even when the HEMT 200 is biased to be in an off-state. Additionally, as described above, electron traps that are associated with, for example, defects at the upper surface of the barrier layer 240 may hold charges which may result in charge collecting at the interface of the barrier layer 240 and the channel layer 230 that may reduce or block current flow along the 2DEG layer 232 even when the gate contact 254 is unbiased (i.e., when the HEMT 200 is biased to be in the on-state). While these charges will dissipate over time, when the HEMT 200 is used, for example, as an RF amplifier, the gate bias voltage cycles at high speed between the on-state and the off-state, and the charges resulting from the electron traps may thus hold energy in the vicinity of the 2DEG layer 232. As the gate bias voltage is removed to switch the HEMT 200 into its on-state, the charge may have a "memory effect" that is referred to herein as "drain lag" that may at least partially block current flow through the 2DEG layer 232 after the gate bias voltage is removed. Drain lag results in non-linearities that may give rise to passive intermodulation distortion, which may seriously degrade the performance of a communications system that includes the HEMT 200 as an RF transistor amplifier.

The drain current drift performance of a HEMT is one characterization of the above-described drain lag effect. The drain current drift performance may be measured by applying direct current ("DC") bias voltages to the HEMT that bias the HEMT in its on-state and then seeing how the drain current IDS changes over time under such steady state operating conditions. This is shown graphically in FIG. 4. Theoretically, a steady state condition should be reached so that the drain current IDS will be constant, as shown by the curve labeled "Ideal" in FIG. 4. However, due to mechanisms such as the above-discussed charge build-up, a depletion region may form that may partially block the 2DEG channel, which may cause the drain current to decrease over time as shown by curve labelled "With Drain Current Drift" in FIG. 4.

As discussed above, pursuant to embodiments of the present invention, HEMTs having improved passivation structures are provided that may exhibit significantly improved drain current drift performance. These improved passivation structures may modulate the electron traps in the upper surface of the semiconductor layer structure 202 in order to reduce the amount of charge that builds up in the electron traps. By modulating the electron traps in this manner, the drain current drift performance of the HEMT may be improved.

FIG. 3C is an enlarged view of the region labeled "3C" in FIG. 3B. FIG. 3C illustrates a small portion of one of the multi-layer passivation structures 260 (here multi-layer passivation structure 260-2) and the spacer passivation layer 270 (here spacer passivation layer 270-2) that is provided on one side (here the drain side) of the gate contact 254. It will be appreciated that the multi-layer passivation structure 260-1 and the spacer passivation layer 270-1 that are provided on the other side (the source side) of the gate contact 254 may be a mirror image of what is shown in FIG. 3C.

As shown in FIG. 3C, the multi-layer passivation structure 260 includes a first passivation layer 262, a second passivation layer 264 and a third passivation layer 266 that are sequentially stacked on the vertical direction on the semiconductor layer structure 202 (and, more particularly, on the barrier layer 240). The first passivation layer 262 may be a first silicon nitride layer 262, the second passivation layer 264 may be a second silicon nitride layer 264, and the third passivation layer 266 may be a third silicon nitride layer 266. The first silicon nitride layer 262 may directly contact the semiconductor layer structure 202, the second silicon nitride layer 264 may directly contact the first silicon nitride layer 262, and the third silicon nitride layer 266 may directly contact the second silicon nitride layer 264. The second silicon nitride layer 264 is in between the first and third silicon nitride layers 262, 266. It will be appreciated that only two passivation layers or more than three passivation layers may be included in the multi-layer passivation structure 260 in other embodiments. For example, the second silicon nitride layer 264 or the third silicon nitride layer 266 may be omitted in some embodiments, or the second and third silicon nitride layers 264, 266 may be replaced with a single, thicker silicon nitride layer.

The first silicon nitride layer 262 may be formed by sputtering or physical vapor deposition (PVD), and may be a high quality silicon nitride layer that includes fewer electron traps than are present in silicon nitride layers that are formed by chemical vapor deposition (CVD). Since the first silicon nitride layer 262 is formed by sputtering or PVD, the upper surface of the semiconductor layer structure 202 may suffer little or no damage during the formation of the first silicon nitride layer 262. The first silicon nitride layer 262 may be a non-stoichiometric silicon nitride that is silicon-rich. The silicon-rich silicon nitride may comprise a charge dissipation material that acts to dissipate charges that build up in the electron traps along the upper surface of the barrier layer 240. A charge dissipation material refers to a material that substantially dissipates charges that are trapped at the upper surface of an underlying semiconductor layer. The charge dissipation material may counteract the charges in the electron traps, provide dissipation paths for the charges, or otherwise act to reduce the amount of charge that builds up in the barrier layer 240. As a result, less charge may be present in the semiconductor structure 202, and hence the amount of drain lag may be reduced. While the first silicon nitride layer 262 may be a silicon-rich non-stoichiometric silicon nitride layer, it may only be moderately silicon-rich in order to avoid increasing leakage currents and/or to avoid negatively impacting the off-state performance of the HEMT 200. In example embodiments, a thickness of the first silicon nitride layer 262 may be between about 10 nm and about 40 nm.

The second silicon nitride 264 may be formed by CVD. The second silicon nitride layer 264 may also be formed of a non-stoichiometric silicon nitride that is silicon-rich, and may be more silicon-rich than the first silicon nitride layer. In example embodiments, a thickness of the second silicon nitride layer 264 may be between about 10 nm and about 40 nm.

The third silicon nitride 266 may be formed by CVD. The third silicon nitride layer 266 may also be formed of a non-stoichiometric silicon nitride that is silicon-rich, and may be more silicon-rich than the first silicon nitride layer. In example embodiments, a thickness of the third silicon nitride layer 266 may be between about 10 nm and about 40 nm.

In example embodiments, the multi-layer passivation structure 260 may have a thickness of about 50-80 nm, and each of the first through third silicon nitride layers 262, 264, 266 may have a thickness that is between 20% and 45% of the total thickness of the multi-layer passivation structure 260.

The spacer passivation layer 270 is formed directly on the semiconductor layer structure 202 in between the gate contact 254 and the multi-layer passivation structure 260. The spacer passivation layer 270 may directly contact the semiconductor layer structure 202, the multi-layer passivation structure 260 and the gate contact 254. The spacer passivation layer 270 may completely cover the sidewall of the multi-layer passivation structure 260 (i.e., it may cover all three of the first through third silicon nitride layers 262, 264, 266). Typically, the sidewall of the multi-layer passivation structure 260 will be an angled sidewall, and the spacer passivation layer 270 will cover this sidewall as well as a portion of the upper surface of the semiconductor layer structure 202. The outer wall of the spacer passivation layer 270 that faces the gate contact 254 may have a concave profile that results from the partial etch of a fourth silicon nitride layer 268 (described below) that forms at least a portion of the spacer passivation layer. As shown in FIG. 3C, the spacer passivation layer 270 may have a generally triangular shape in some embodiments, where the longer side of the triangle has a concave profile.

Figure 3D:
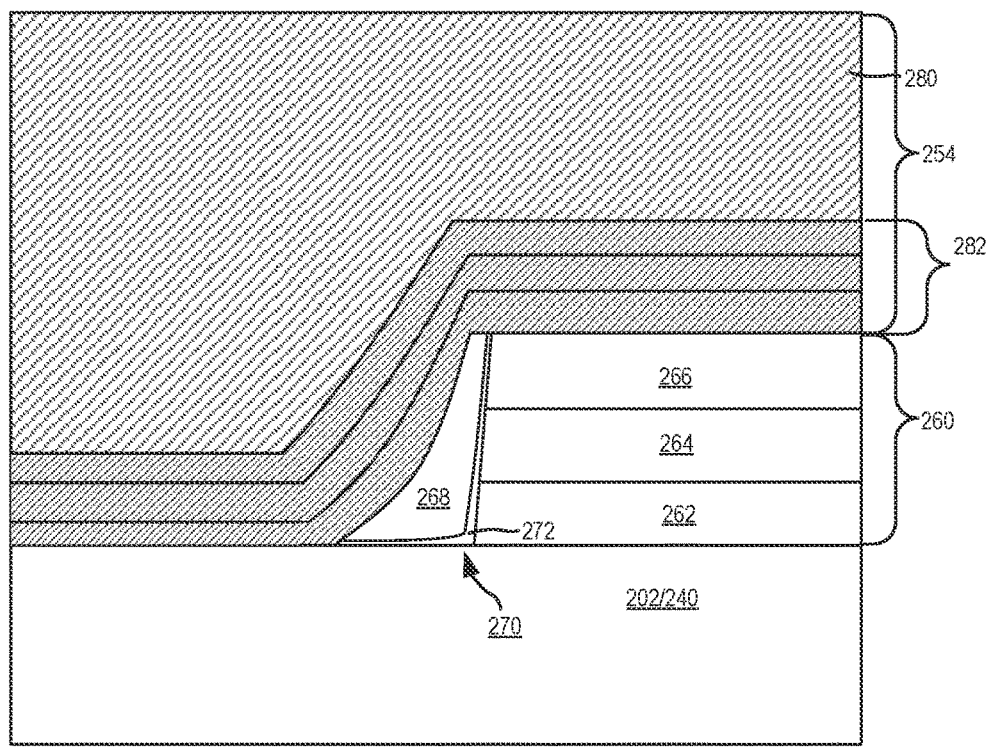
FIG. 3D is a schematic cross-sectional view of a modified version of the HEMT of FIG. 3B.
Figure 3E:
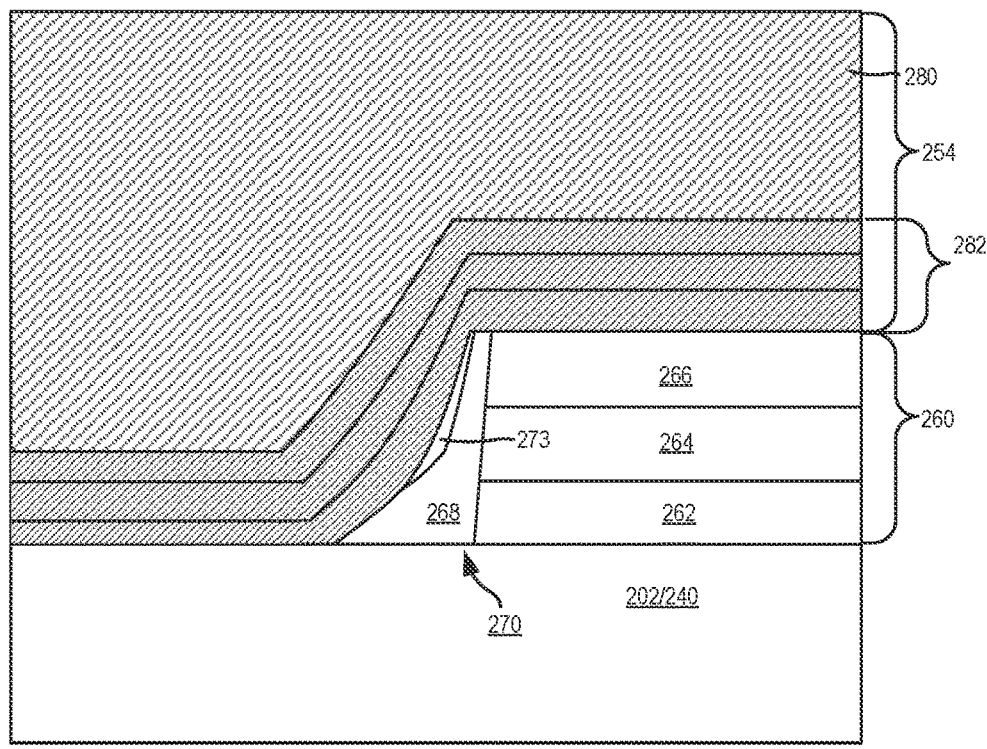
FIG. 3E is a schematic cross-sectional view of another modified version of the HEMT of FIG. 3B.
Figure 4:
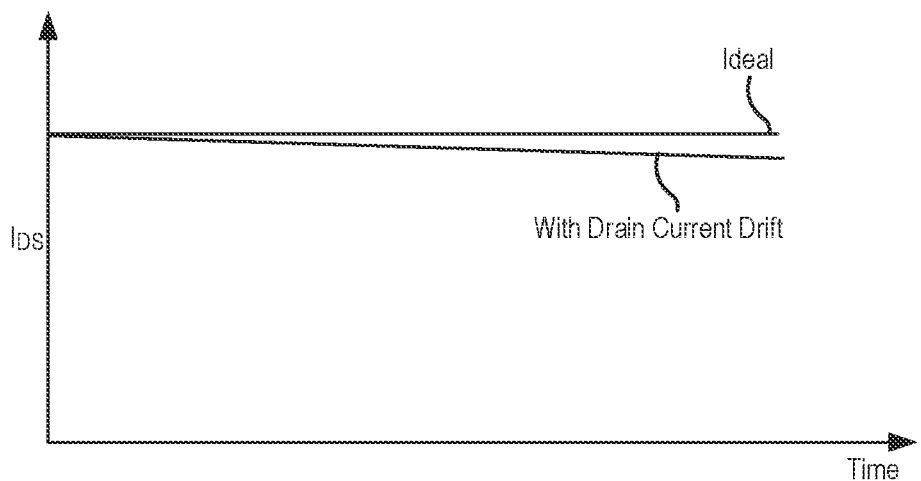
FIG. 4 is a graph illustrating how the source-to-drain current of a HEMT may change over time during steady-state operating conditions due to drain current drift.

In some embodiments, the spacer passivation layer 270 may be a single silicon nitride layer that is formed, for example, from etching the above-discussed fourth silicon nitride layer 268. In such embodiments, the spacer passivation layer 270 may have the shape shown in FIG. 3C. In other embodiments, the spacer passivation layer 270 may be a multi-layer structure. For example, FIG. 3D illustrates a modified version of the device of FIG. 3C where the spacer passivation layer 270 comprises a two layer structure that includes the remnants of the fourth silicon nitride layer 268 as well as a fifth silicon nitride layer 272. In such embodiments, the fifth silicon nitride layer 272 may be a thin layer that has an L-shape, as shown. It will also be appreciated that other configurations are possible. For example, in the embodiments of FIGS. 3C and/or 3D an upper portion of the fourth silicon nitride layer 268 could be replaced with a silicon oxide layer or a silicon oxynitride layer in still further embodiments. For example, FIG. 3E is a schematic cross-sectional view of the HEMT of FIG. 3C that has been modified so that a portion of the fifth silicon nitride layer 272 is replaced with a layer 273 that contains silicon and oxygen, such as a silicon oxide layer or a silicon oxynitride layer. It will also be appreciated that in any of the embodiments described herein the multi-layer passivation structure 260 may further include an additional layer that contains silicon and oxygen, such as a silicon oxide layer or a silicon oxynitride layer, where this additional layer is sufficiently spaced apart from the semiconductor layer structure 202.

The spacer passivation layer 270 may comprise one or more layers of non-stoichiometric silicon nitride that are silicon-rich, and may be more silicon-rich than the first silicon nitride layer 262. The one or more silicon nitride layers included in the spacer passivation layer 270 may also be more silicon-rich than the second silicon nitride layer 264 and/or the third silicon nitride layer 266. The one or more layers forming the spacer passivation layer 270 may be formed by CVD in some embodiments. Other deposition techniques may alternatively be used, including physical vapor deposition ("PVD"), atomic layer deposition ("ALD"), plasma enhanced ALD ("PEALD") or plasma enhanced PVD ("PEPVD").

The spacer passivation layer 270 may extend longitudinally along the full length of the gate contact 254, as shown in FIG. 3A. In contrast, the spacer passivation layer 270 may only extend a short distance in the lateral direction (i.e., in a direction parallel to the upper surface of the semiconductor layer structure 202 and perpendicular to the longitudinal axis of the gate contact 254, which corresponds to the horizontal direction in FIG. 3C). For example, the spacer passivation layer 270 may extend less than 10% a distance between the gate contact 254 and the drain contact 252 in the lateral direction in some embodiments, and less than 5% the distance between the gate contact 254 and the drain contact 252 in the lateral direction in other embodiments. A bottom surface of the spacer passivation layer 270 may define the "width" of the spacer passivation layer 270 in some embodiments. Since the width of the spacer passivation layer 270 in the lateral direction is small, the fact that it may be very silicon-rich silicon nitride does not result in other negative performance impacts. In example embodiments, the width of each spacer passivation layer in the lateral direction may be less than 100 nm, or less than 60 nm, or even less than 40 nm. In contrast, the distance between the gate contact and the drain contact may exceed 3 microns. The width of the gate contact 254 in the lateral direction (which conventionally is called the "gate length") may be, for example, about 0.25 microns.

As discussed above, the silicon nitride layers included in the multi-layer passivation structure 260 and the spacer passivation layer 270 may have different silicon and nitrogen concentrations from each other. In some embodiments, each of these layers may be silicon-rich silicon nitride layers. Stochiometric silicon nitride has the chemical formula of SixNy where x=3 and y=4. In some embodiments of the present invention, the silicon nitride layers included in the multi-layer passivation structure 260 and the spacer passivation layer 270 may have silicon-to-nitrogen ("Si:N") ratios as shown in the table below. The table shows both nominal values for the Si:N ratios, a range of variation about each Si:N ratio according to some embodiments, and a wider range of variation about each Si:N ratio according to further embodiments of the present invention.

| Layer | Si:N Ratio | +/− Range | Wider +/− Range |
|---|---|---|---|
| Layer 262 | 0.39 | 0.01 | 0.02 |
| Layer 264 | 0.5 | 0.03 | 0.05 |
| Layer 266 | 0.5 | 0.03 | 0.05 |
| Layer 268 | 0.57 | 0.03 | 0.05 |
| Layer 272 | 0.41 | 0.01 | 0.02 |

The silicon-to-nitrogen ratios for of each of the above layers may be determined, for example, using Rutherford Backscattering techniques. It will also be appreciated that the refractive index may be used as a proxy for the silicon-to-nitrogen ratios of a silicon nitride layer. For CVD films, the higher the refractive index, the more silicon-rich the silicon nitride layer is. Thus, in other embodiments, the silicon nitride layers included in the multi-layer passivation structure 260 and the spacer passivation layer 270 may have refractive indexes within the following ranges:

| Layer | Refractive Index |
|---|---|
| Layer 262 | 1.96-2.02 |
| Layer 264 | 1.97-2.03 |
| Layer 266 | 1.97-2.03 |
| Layer 272 | 1.99-2.05 |
| Layer 268 | 2.07-2.13 |

As shown best in FIG. 3C, the gate contact 254 may extend onto an upper surface of the spacer passivation layer 270. The spacer passivation layer 270 may not be quite triangular in shape due to this upper surface and the concave profile of the outer side 278, although in some cases the two vertically-extending sidewalls of the spacer passivation layer 270 may meet or nearly meet so that the spacer passivation layer 270 only has three sides and hence is more triangular in shape.

As is further shown in FIG. 3C, the gate contact 254 may be a multi-layer contact, and may include a plurality of thin layers 282 that are conformally formed on the semiconductor layer structure 202 and on the multi-layer passivation structures 260, as well as a bulk metal layer 280 that is formed on the thin conformal layers 282. The thin conformal layers 282 may comprise, for example, an adhesion layer, a diffusion barrier layer and/or a contact layer.

FIGS. 5A-5I illustrate a method of forming the HEMT 200 according to embodiments of the present invention of FIGS. 3A-3C.

Figure 5A:
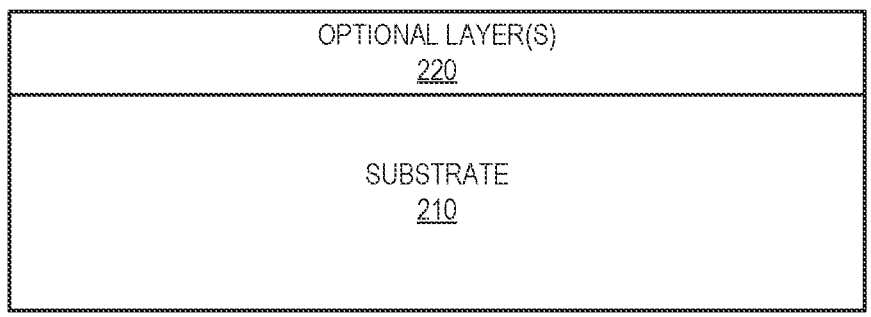
FIGS. 5A-5I are schematic cross-sectional diagrams illustrating a method of fabricating a HEMT according to embodiments of the present invention.

As shown in FIG. 5A, one or more optional buffer layers, nucleation layers and/or transition layers 220 may be formed on substrate 210 such as, for example, a silicon carbide substrate. The buffer/nucleation/transition layers 220 may comprise, for example, Group III nitride layers such as aluminum nitride, gallium nitride and the like. The optional layers 220 may facilitate growth of high quality Group III nitride layers on the substrate 210 despite, for example, a lattice mismatch between the substrate 210 and the channel and barrier layers 230, 240 that are formed higher in the device structure. The optional buffer/nucleation/transition layers 220 may be formed by metal organic chemical vapor deposition (MOCVD) or by other techniques known to those of skill in the art, such as molecular beam epitaxy (MBE) or high vapor pressure epitaxy (HVPE).

Figure 5B:
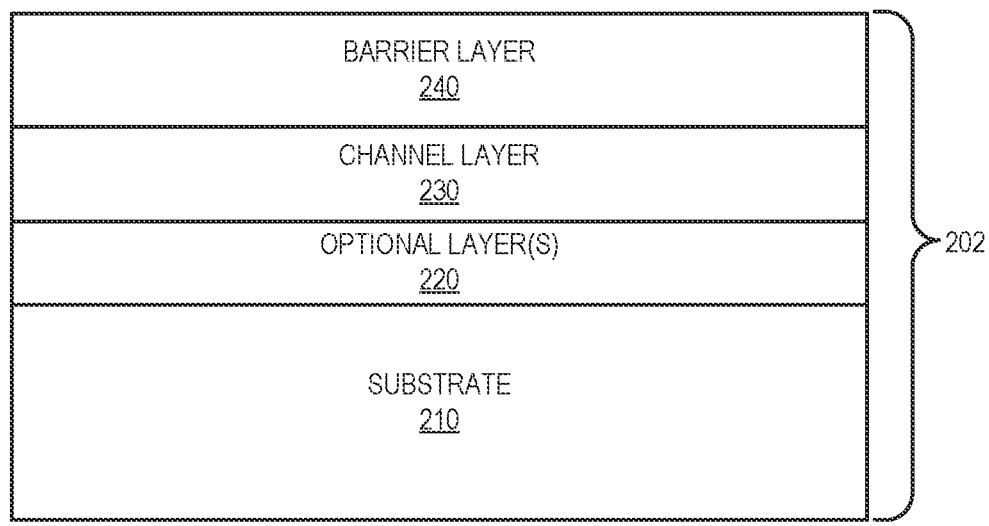

As shown in FIG. 5B, a channel layer 230 may be formed on an upper surface of the buffer layer(s) 220, and a barrier layer 240 may be formed on an upper surface of the channel layer 230. The channel layer 230 and/or the barrier layer 240 may be deposited, for example, by MOCVD, MBE or HVPE. The channel layer 230 may have a bandgap that is less than the bandgap of the barrier layer 240 and the channel layer 230 may also have a larger electron affinity than the barrier layer 240. The channel layer 230 and the barrier layer 240 may include Group III-nitride based materials. For example, the channel layer 230 may comprise a gallium nitride layer, and the barrier layer 240 may comprise an $Al_xGa_{1-x}N$, where $0<x<1$, The channel layer 230 may be undoped ("unintentionally doped") and may be grown to a thickness of greater than about 20 Å. The barrier layer 240 may be undoped or doped with an n-type dopant in example embodiments.

Figure 5C:
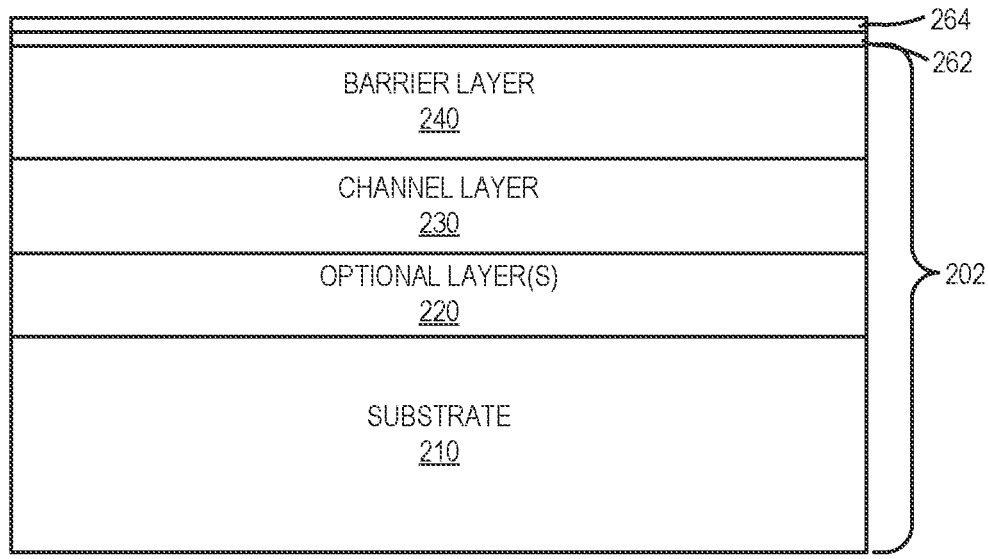

Referring to FIG. 5C, a first silicon nitride layer 262 may be blanket deposited on the barrier layer 240. As discussed above, the first silicon nitride layer 262 may be formed by sputtering or PVD and may be a non-stoichiometric silicon nitride that is silicon-rich. In example embodiments, a thickness of the first silicon nitride layer 262 may be between about 10 nm and about 40 nm. Next, a second silicon nitride layer 264 may be blanket deposited on the first silicon nitride layer 262. The second silicon nitride layer 264 may be formed by CVD and may be a non-stoichiometric silicon nitride that is more silicon-rich than the first silicon nitride layer 262. In example embodiments, a thickness of the second silicon nitride layer 264 may be between about 10 nm and about 40 nm.

Figure 5D:
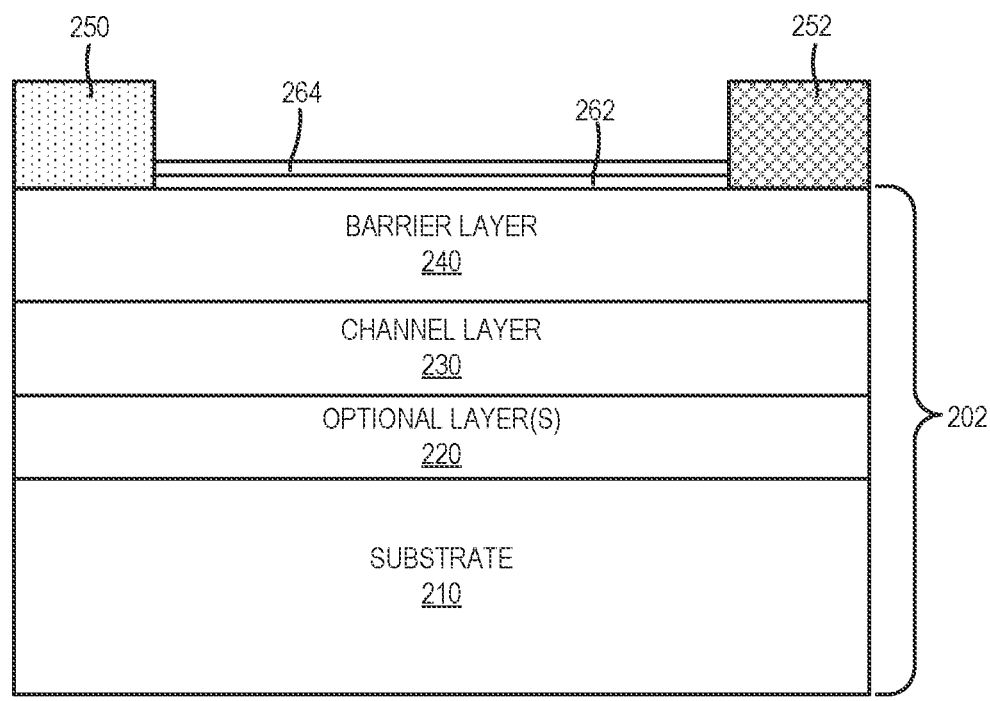

Referring to FIG. 5D, an etch mask (not shown) may then be formed on the second passivation layer 264, and this etch mask may be patterned using standard photolithography techniques. The first and second silicon nitride layers 262, 264 may then be etched using the patterned etch mask to form openings (not shown, but located in the positions of the source and drain contacts 250, 252) therein. One or more metal layers may then be formed that are used to form the source contact 250 and the drain contact 252. The source contact 250 and the drain contact 252 may include a metal, such as TiAlN, that can form an ohmic contact to a gallium nitride based semiconductor material. The ohmic metal may be blanket deposited on the device by, for example, sputtering, and then appropriate masking and etching steps may be performed to form the source contact 250 and the drain contact 252 while removing the remaining metal.

Figure 5E:
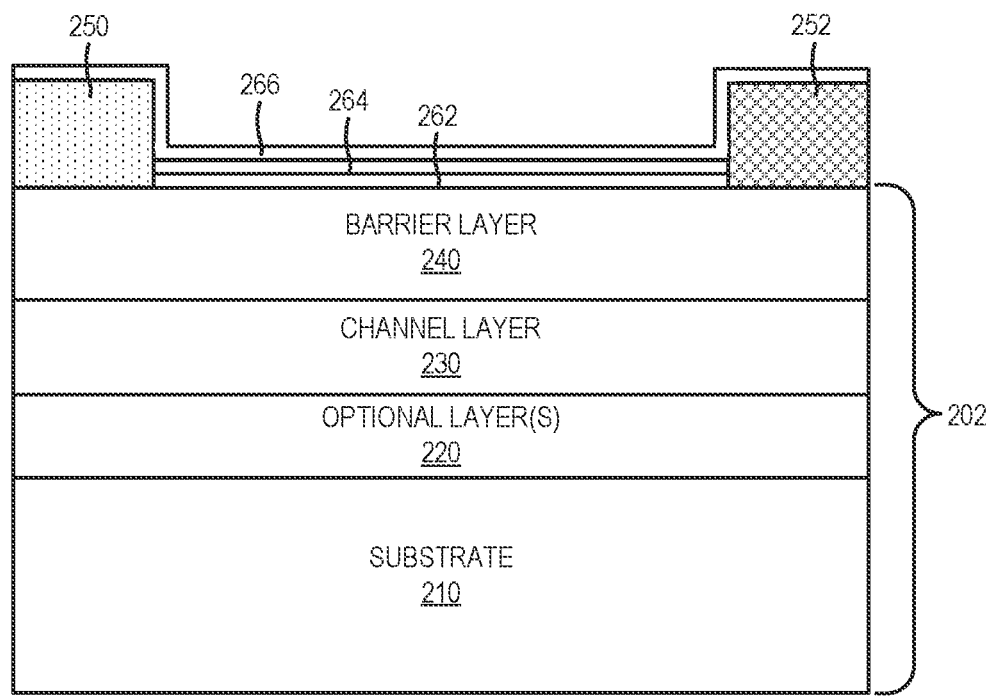

Referring to FIG. 5E, a third silicon nitride layer 266 is blanket deposited on the second silicon nitride layer 264 and on the source and drain contacts 250, 252. The third silicon nitride layer 266 may be formed by CVD and may be a non-stoichiometric silicon nitride that is more silicon-rich than the first silicon nitride layer 262. In example embodiments, a thickness of the third silicon nitride layer 266 may be between about 10 nm and about 40 nm. The third silicon nitride layer 266 may comprise the same material as the second silicon nitride layer 264 in some embodiments. The boundary between the first and second silicon nitride layers 264, 266 may be detectable because of oxygen atoms that are collected at the interface therebetween during the processing steps discussed above with reference to FIG. 5D.

Figure 5F:
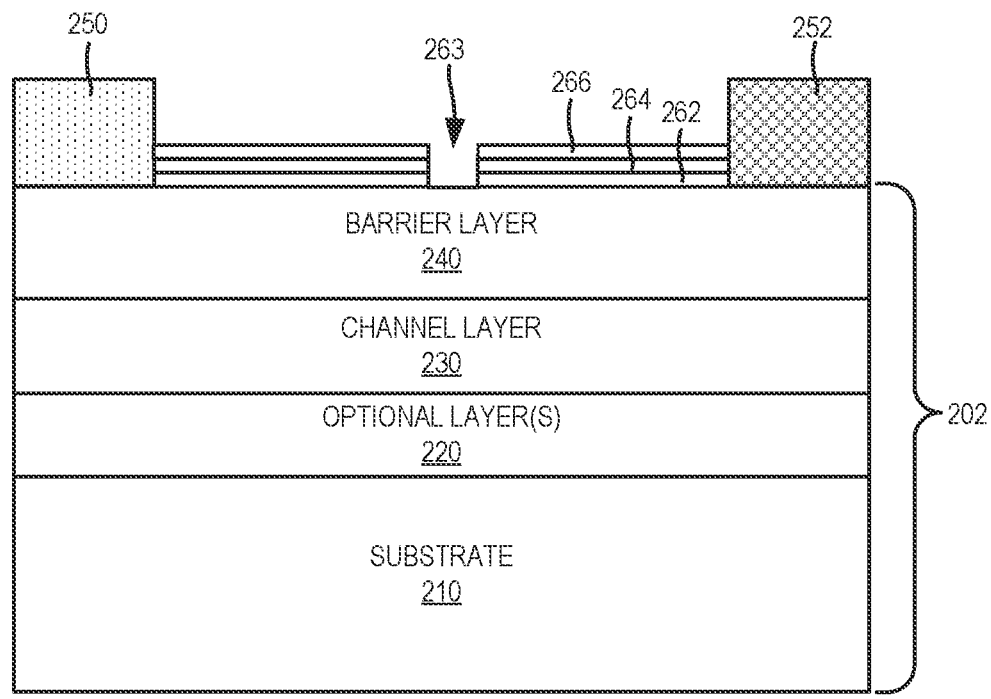

Referring to FIG. 5F, an etch mask (not shown) may then be formed on the third passivation layer 266, and this etch mask may be patterned using standard photolithography techniques to form openings above the source contact 250, the drain contact 252 and the location where a gate contact 254 will be formed in a later processing step. The third silicon nitride layer 266 may then be etched using the patterned etch mask to expose the source and drain contacts 250, 252 and to form an opening 263 that exposes a portion of the semiconductor layer structure 202. The etch mask may then be removed.

Figure 5G:
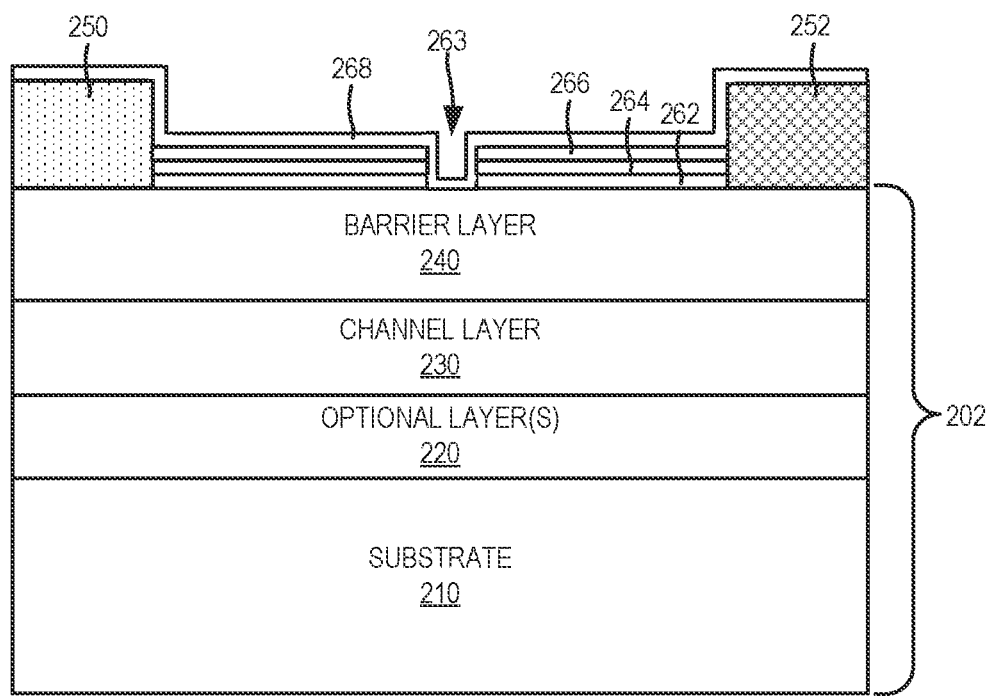

Referring to FIG. 5G, a fourth silicon nitride layer 268 is blanket deposited on the third silicon nitride layer 266, on the source and drain contacts 250, 252, and in the opening 263. The fourth silicon nitride layer 268 may be formed by CVD in example embodiments. The fourth silicon nitride layer 268 may comprise a non-stoichiometric silicon nitride that is silicon-rich, and may be more silicon-rich than all three of the first through third silicon nitride layers 262, 264, 266 in some embodiments.

Figure 5H:
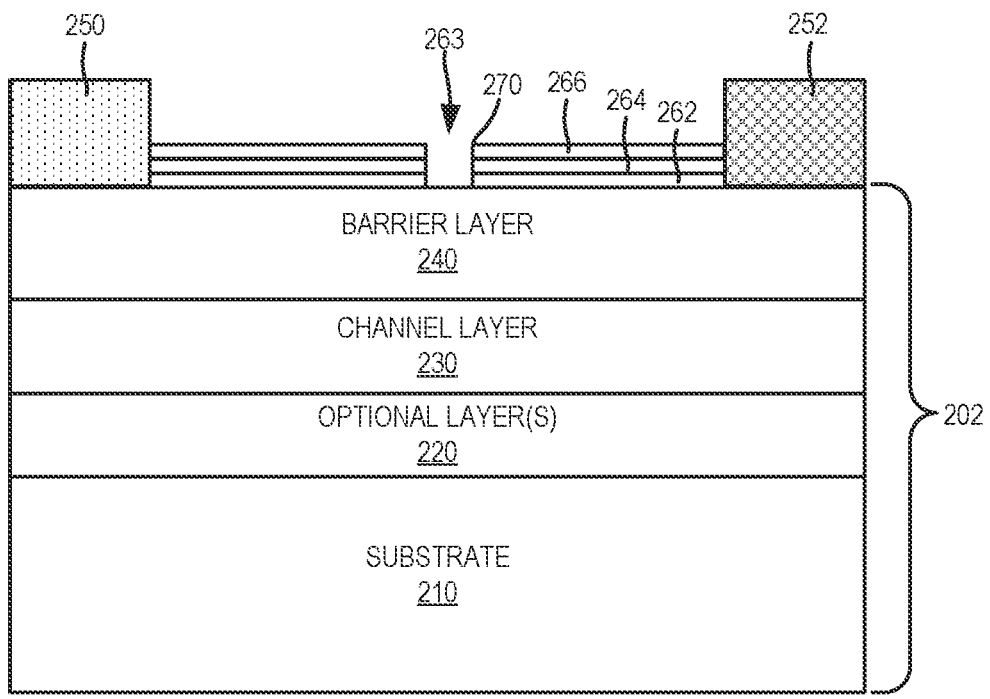

Referring to FIG. 5H, an isotropic etch is performed to substantially remove the fourth silicon nitride layer 268. The isotropic etch removes the fourth silicon nitride layer 268 from all generally flat surfaces. However, because the isotropic etch etches flat regions of the fourth silicon nitride layer 268 much more quickly than sidewall regions, the fourth silicon nitride layer 268 that extends on the sidewalls of the multi-layer passivation structure 260 is not completely removed, as is best seen in the enlarged view of FIG. 3C above. The remaining portions of the fourth silicon nitride layer 268 after this etching step form a pair of spacer passivation layers 270 that are formed on the sidewalls of the opening 263 for the gate contact 254, as shown best in FIG. 3C.

Figure 5I:
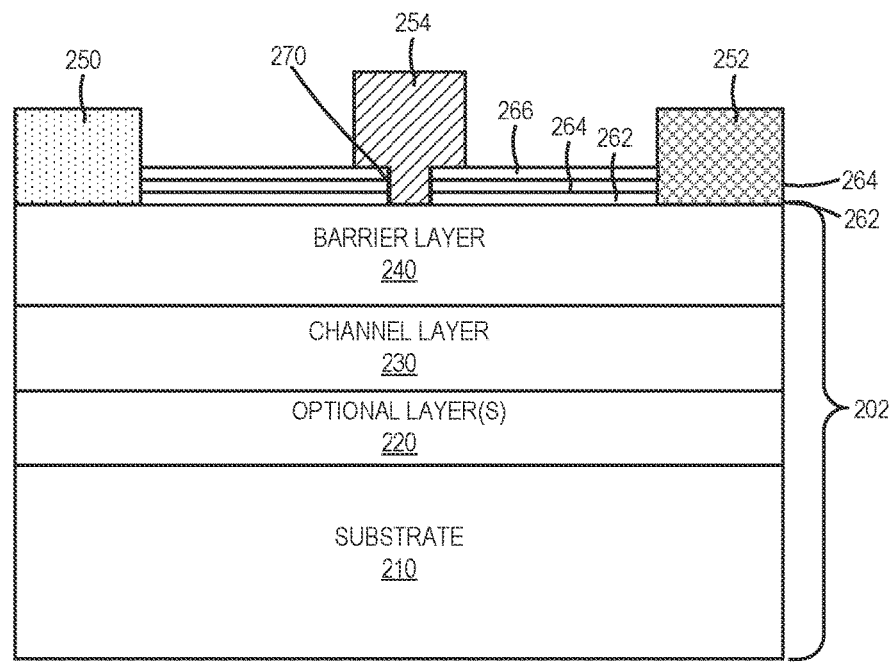

Referring to FIG. 5I, the gate contact 254 is formed in the opening 263. As discussed above with reference to FIG. 3C, the gate contact 254 comprises a plurality of thin layers 282 that can include, for example, an adhesion layer, a diffusion barrier layer and/or a contact layer. Each of these thin layers 282 may be formed conformally on the underlying structure. A bulk metal layer 280 is formed on the thin metal layers 282 (see FIG. 3C).

The bottom portion of the gate contact 254 directly contacts the semiconductor layer structure 202 and the spacer passivation layers 270-1, 270-2, and the upper portion of the gate contact 254 may directly contact the upper surface of the multi-layer passivation structure 260. The material used to form the gate contact 254 may include a material capable of making a Schottky contact to a gallium nitride based semiconductor material, such as, for example, Ni, Pt, $NiSi_x$, Cu, Pd, Cr, W and/or WSiN.

It will be appreciated that FIGS. 5A-5I illustrate a method of forming a device that includes a multi-layer passivation structure 260 that has three silicon nitride layers and a spacer passivation layer 270 that has a single silicon nitride layer. As discussed above, in other embodiments the multi-layer passivation structure 260 may have only two silicon nitride layers or more than three silicon nitride layers, and/or the spacer passivation layer may include more than one silicon nitride layer.

Figure 6A:
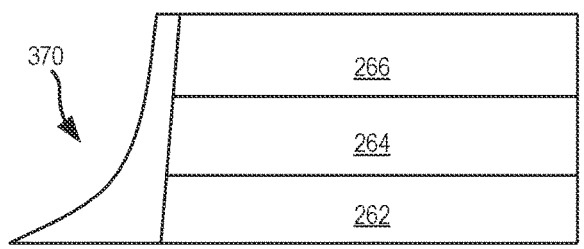
FIGS. 6A-6C are schematic cross-sectional views of alternative spacer passivation layers that may be used in the HEMTs according to embodiments of the present invention.
Figure 6B:
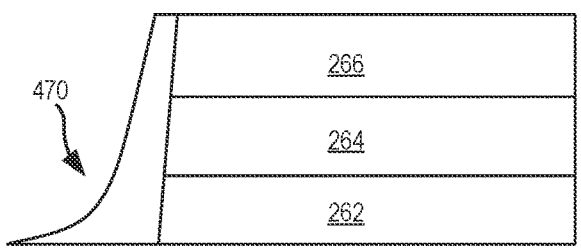
Figure 6C:
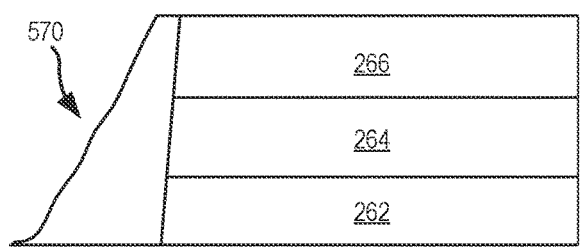

FIGS. 6A-6C are schematic cross-sectional views of spacer passivation layers 370, 470, 570, respectively, that may be used in place of the spacer passivation layer 270 of HEMT 200. As shown in FIG. 6A, the spacer passivation layer 370 is similar to spacer passivation layer 270, except that it is more heavily concave than the spacer passivation layer 270. As shown in FIG. 6B, the spacer passivation layer 470 is similar to spacer passivation layer 270, except that the upper portion of spacer passivation layer 470 is slightly thicker than the corresponding portion of spacer passivation layer 270 while the lower portion of spacer passivation layer 470 is slightly thinner than the corresponding portion of spacer passivation layer 270. As shown in FIG. 6C, the spacer passivation layer 570 is similar to spacer passivation layer 270, except that the concave sidewall of spacer passivation layer 570 is less smooth and reflects the fact that the etching will not occur evenly and hence in most practical embodiments the concave sidewall will be somewhat "rough."

Figure 7A:
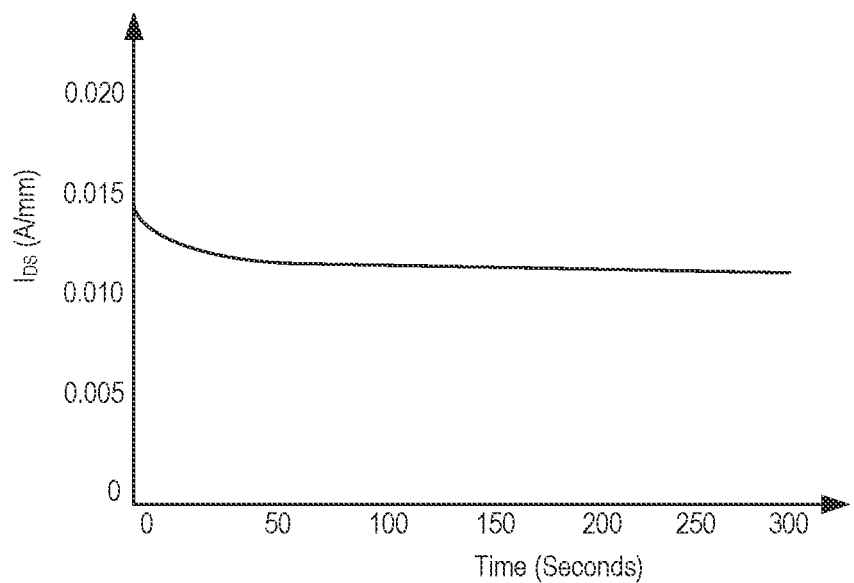
FIGS. 7A and 7B are graphs illustrating the measured quiescent drain current performance of a conventional HEMT and a HEMT according to embodiments of the present invention, respectively.
Figure 7B:
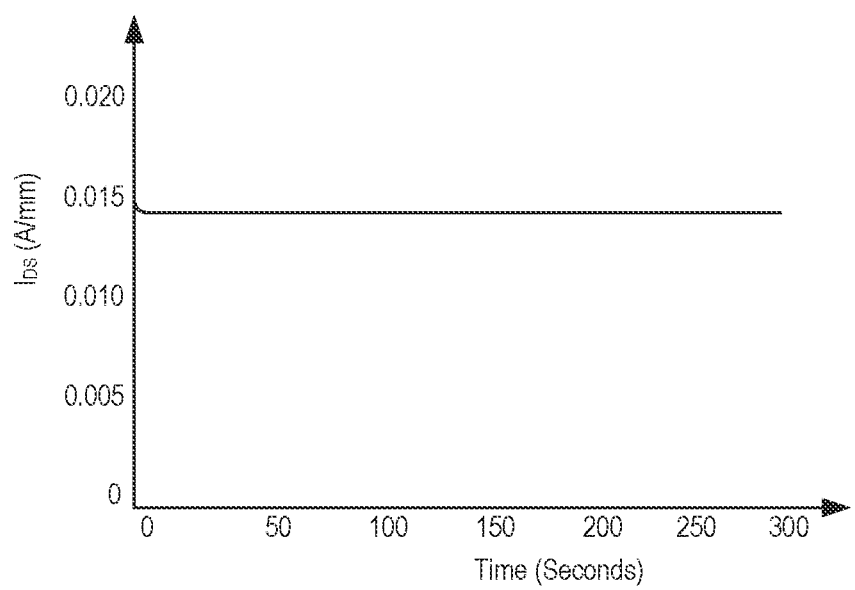

The HEMTs according to embodiments of the present invention may exhibit dramatically improved drain current drift performance. FIG. 7A is a graph illustrating the drain current as a function of time from device turn-on for a conventional high power, high frequency gallium nitride based HEMT. As shown in FIG. 7A, the drain current of the conventional HEMT exhibits drops by about 25-30% from its initial value within 5 minutes of device turn-on, with almost all of the drop occurring in the first fifty seconds. As shown in FIG. 7B, the drain current in the HEMTs according to embodiments of the present invention may drop less than 10% from its initial value, and in some embodiments may drop less than 5% or even less than 3%. Keeping the drain bias current constant during operation may significantly improve the performance of a HEMT power amplifier, as it improves the drain efficiency, power adjusted efficiency and output power.

The improved drain current drift performance that is achieved in the HEMTs according to embodiments of the present invention may directly result from aspects of the passivation structures that are formed on the semiconductor layer structure. For instance, a spacer passivation layer that is formed of a silicon-rich silicon nitride layer is interposed between the gate contact and the multi-layer passivation structure. This spacer passivation layer ensures that the first silicon nitride layer of the multi-passivation structure does not physically touch the gate contact, which can improve the drain current drift performance. In addition, the concave sidewall of the spacer passivation layer makes it easier for the gate contact to conformally form on the spacer passivation layer, and the concave surface also may advantageously direct the electric fields in desired directions. A height of the multi-layer passivation structure may also be optimized to improve the drain current drift performance.

Additionally, the deposition of the fourth silicon nitride layer (that is later etched to form the spacer passivation layers) may heal electron traps that have been formed at the upper surface of the semiconductor layer structure. Moreover, while a second etch is performed to form the spacer passivation layers, this etch may be performed using more "gentle" etching conditions that are less prone to forming additional electron traps.

Figure 8:
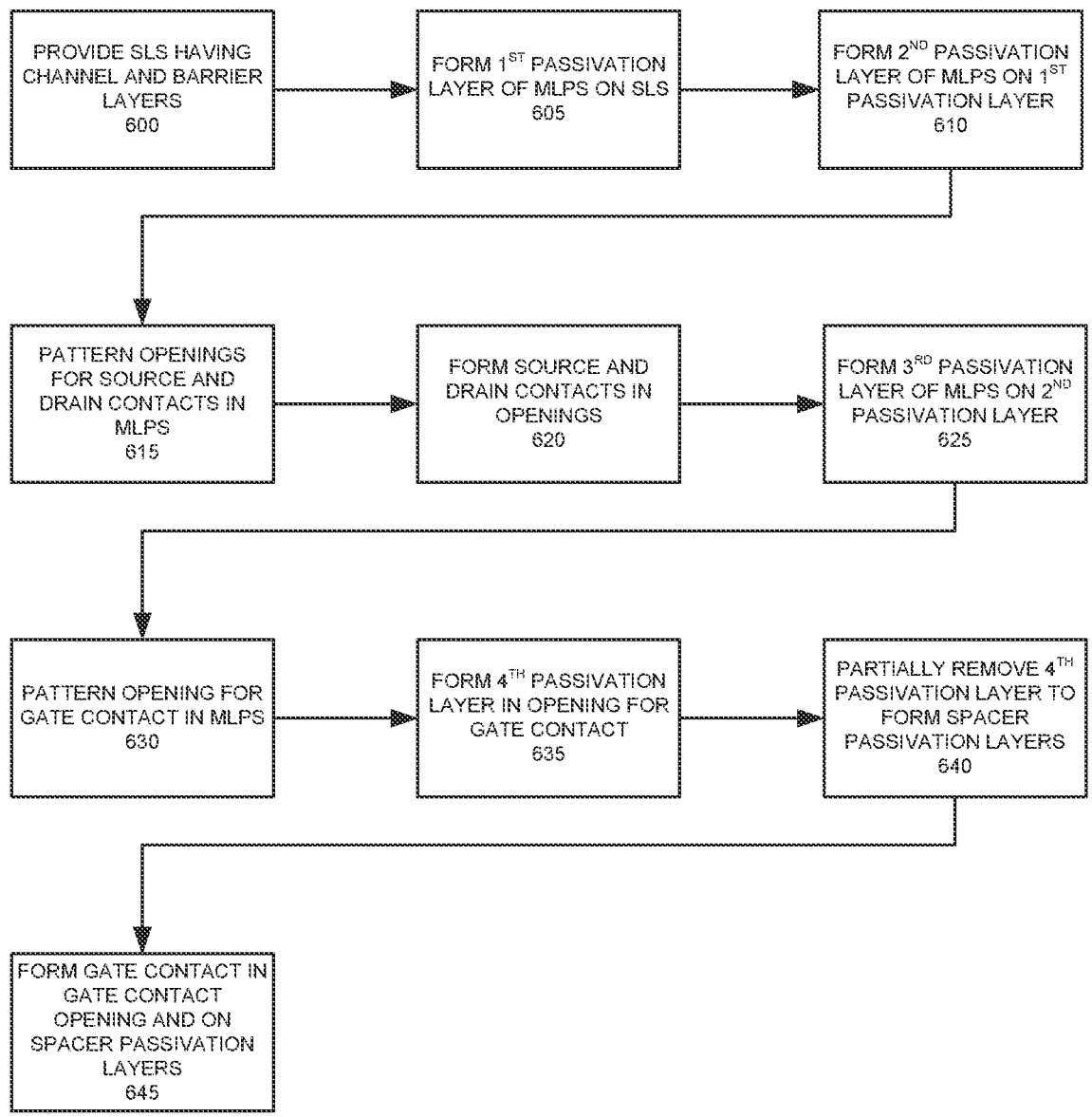
FIG. 8 is a flow chart of a method of fabricating a HEMT according to additional embodiments of the present invention.

FIG. 8 is a flow chart illustrating a method of fabricating a HEMT according to embodiments of the present invention. As shown in FIG. 8, a semiconductor layer structure (SLS in FIG. 8) may be provided that includes a channel layer and a barrier layer, such as semiconductor layer structure 202 (operation 600). The semiconductor layer structure may comprise, for example, a substrate having a plurality of semiconductor epitaxial layers formed thereon.

A first passivation layer such as a first silicon nitride layer of a multi-layer passivation structure (MLPS in FIG. 8) may be formed on an upper surface of the semiconductor layer structure (operation 605). A second passivation layer such as a second silicon nitride layer of the multi-layer passivation structure may then be formed on the first passivation layer (operation 610).

Openings may then be patterned in the multi-layer passivation structure for the source and drain contacts (operation 615), and source and drain contacts may be formed in the respective openings (operation 620).

Next, a third passivation layer such as a third silicon nitride layer of the multi-layer passivation structure may then be formed on the second passivation layer (operation 625). Then an opening may be patterned in the multi-layer passivation structure for the gate contact (operation 630). This opening may extend all the way through the multi-layer passivation structure in the vertical direction to expose the semiconductor layer structure.

A fourth passivation layer, such as a fourth silicon nitride layer, may be formed in the opening for the gate contact (operation 635). An etch-back step may then be performed to remove much of the fourth passivation layer while leaving portions of the fourth passivation layer on the sidewalls of the opening for the gate contact (operation 640). These remaining portions form first and second spacer passivation layers that are formed on the sidewalls of the multi-layer passivation structure that face the gate contact opening. A gate contact may then be formed in the gate contact opening (operation 645) so that the first and second spacer passivation layers are interposed between the multi-layer passivation structure (or structures) and the gate contact.

As discussed above, the HEMTs according to embodiments of the present invention may be used as RF transistor amplifiers. The RF transistor amplifiers according to embodiments of the present invention may include one or more amplification stages, with each stage typically implemented as a transistor amplifier. In order to increase the output power and current handling capabilities, these RF transistor amplifiers may be implemented in a unit cell configuration in which a large number of individual "unit cell" transistors are arranged electrically in parallel. The RF transistor amplifier may be implemented as a single integrated circuit chip or "die," or may include a plurality of dies. When multiple RF transistor amplifier die are used, they may be connected in series and/or in parallel.

The RF transistor amplifiers according to embodiments of the present invention may include matching circuits, such as (1) impedance matching circuits that are designed to improve the impedance match (for RF signals at the fundamental operating frequency of the amplifier) between the RF transistor amplifier die and transmission lines connected thereto and (2) harmonic termination circuits that are designed to at least partly terminate harmonics that may be generated during device operation, such as second and third order harmonics or baseband intermodulation products. The RF transistor amplifier die(s) as well as the impedance matching and harmonic termination circuits may be enclosed in a package. Electrical leads may extend from the package to electrically connect the RF transistor amplifier to external circuit elements such as input and output RF transmission lines and bias voltage sources.

The RF transistor amplifiers according to embodiments of the present invention may be designed to operate in a wide variety of different frequency bands. In some embodiments, the RF transistor amplifiers may be configured to operate at frequencies greater than 1 GHz. In other embodiments, these RF transistor amplifier dies may be configured to operate at frequencies greater than 2.5 GHz. In still other embodiments, the RF transistor amplifier dies may be configured to operate at frequencies greater than 3.1 GHz. In yet additional embodiments, these RF transistor amplifier dies may be configured to operate at frequencies greater than 5 GHz. In some embodiments, these RF transistor amplifier dies may be configured to operate in at least one of the 2.5-2.7 GHz, 3.4-4.2 GHz, 5.1-5.8 GHz, 12-18 GHz, 18-27 GHz, 27-40 GHz or 40-75 GHz frequency bands or sub-portions thereof.

Although embodiments of the present invention have been discussed above with respect to a RF transistor amplifier dies that are implemented using HEMT devices, it will be understood that other types of semiconductor devices may be formed in the semiconductor layer structure 202 without deviating from the present invention. For example, the semiconductor layer structure 202 may include a MOSFET, a DMOS transistor, a MESFET, and/or an LDMOS transistor in other embodiments.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

In the specification and the figures, two-part reference numbers (i.e., two numbers separated by a dash, such as 100-1) may be used to identify like elements. When such two-part reference numbers are employed, the full reference numeral may be used to refer to a specific instance of the element, while the first part of the reference numeral may be used to refer to the elements collectively.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A high electron mobility transistor, comprising:
   a semiconductor layer structure that includes a channel layer and a barrier layer on the channel layer;
   a source contact on the semiconductor layer structure;
   a drain contact on the semiconductor layer structure;
   a gate contact on the semiconductor layer structure between the source contact and the drain contact;
   a multi-layer passivation structure on the semiconductor layer structure between the source contact and the drain contact, the multi-layer passivation structure including a plurality of layers that include at least a first silicon nitride layer and a second silicon nitride layer that has a material composition that is different than a material composition of the first silicon nitride layer; and
   a spacer passivation layer on sidewalls of both the first silicon nitride layer and the second silicon nitride layer,
   wherein a material composition of the spacer passivation layer is different than a material composition of at least one of the layers of the multi-layer passivation structure,
   wherein a bottom surface of the spacer passivation layer is coplanar with a bottom surface of the gate contact,
   wherein the first silicon nitride layer directly contacts the barrier layer and the second silicon nitride layer is on the first silicon nitride layer opposite the barrier layer, where the second silicon nitride layer is more silicon-rich than the first silicon nitride layer, and
   wherein the multi-layer passivation structure further comprises a third silicon nitride layer on the second silicon nitride layer opposite the first silicon nitride layer, where the third silicon nitride layer is more silicon-rich than the first silicon nitride layer.

2. The high electron mobility transistor of claim 1, wherein the spacer passivation layer directly contacts sidewalls of all three of the first through third silicon nitride layers.

3. The high electron mobility transistor of claim 1, wherein the spacer passivation layer is in between the multi-layer passivation structure and the gate contact.

4. The high electron mobility transistor of claim 1, wherein the bottom surface of the spacer passivation layer is coplanar with a bottom surface of the multi-layer passivation structure.

5. A high electron mobility transistor, comprising:
   a semiconductor layer structure that includes a channel layer and a barrier layer on the channel layer;
   a source contact on the semiconductor layer structure;
   a drain contact on the semiconductor layer structure;
   a gate contact on the semiconductor layer structure between the source contact and the drain contact;
   a multi-layer passivation structure on the semiconductor layer structure between the source contact and the drain contact, the multi-layer passivation structure including a plurality of layers that include at least a first silicon nitride layer and a second silicon nitride layer that has a material composition that is different than a material composition of the first silicon nitride layer; and
   a spacer passivation layer on sidewalls of both the first silicon nitride layer and the second silicon nitride layer,
   wherein a material composition of the spacer passivation layer is different than a material composition of at least one of the layers of the multi-layer passivation structure,
   wherein the first silicon nitride layer directly contacts the barrier layer and the second silicon nitride layer is on the first silicon nitride layer opposite the barrier layer, where the second silicon nitride layer is more silicon-rich than the first silicon nitride layer,
   wherein the multi-layer passivation structure further comprises a third silicon nitride layer on the second silicon nitride layer opposite the first silicon nitride layer, where the third silicon nitride layer is more silicon-rich than the first silicon nitride layer, and
   wherein the spacer passivation layer comprises a silicon-rich silicon nitride layer that is more silicon-rich than all three of the first silicon nitride layer, the second silicon nitride layer, and the third silicon nitride layer.

6. A high electron mobility transistor, comprising:
   a semiconductor layer structure that includes a channel layer and a barrier layer on the channel layer;
   a source contact on the semiconductor layer structure;
   a drain contact on the semiconductor layer structure;
   a gate contact on the semiconductor layer structure between the source contact and the drain contact;
   a multi-layer passivation structure on the semiconductor layer structure between the source contact and the drain contact, the multi-layer passivation structure including a plurality of layers that include at least a first silicon nitride layer and a second silicon nitride layer that has a material composition that is different than a material composition of the first silicon nitride layer; and
   a spacer passivation layer on sidewalls of both the first silicon nitride layer and the second silicon nitride layer,
   wherein a material composition of the spacer passivation layer is different than a material composition of at least one of the layers of the multi-layer passivation structure,
   wherein a bottom surface of the spacer passivation layer is coplanar with a bottom surface of the gate contact,
   wherein the spacer passivation layer comprises an inner side that faces the multi-layer passivation structure and an outer side that is opposite the inner side, the outer side having a concave profile.

7. A high electron mobility transistor, comprising:
   a semiconductor layer structure that includes a channel layer and a barrier layer on the channel layer;

a source contact on the semiconductor layer structure;
a drain contact on the semiconductor layer structure;
a gate contact on the semiconductor layer structure between the source contact and the drain contact;
a multi-layer passivation structure on the semiconductor layer structure between the source contact and the drain contact, the multi-layer passivation structure including a plurality of layers that include at least a first silicon nitride layer and a second silicon nitride layer that has a material composition that is different than a material composition of the first silicon nitride layer; and
a spacer passivation layer on sidewalls of both the first silicon nitride layer and the second silicon nitride layer,
wherein a material composition of the spacer passivation layer is different than a material composition of at least one of the layers of the multi-layer passivation structure,
wherein a bottom surface of the spacer passivation layer is coplanar with a bottom surface of the gate contact,
wherein a longitudinal axis of the gate contact extends on the barrier layer in a first direction, the multi-layer passivation structure extends on the barrier layer a first distance in a second direction that is perpendicular to the first direction, and the spacer passivation layer extends on the barrier layer a second distance in the second direction that is less than 5 percent the first distance.

8. A high electron mobility transistor, comprising:
a semiconductor layer structure that includes a channel layer and a barrier layer on the channel layer;
a source contact on the semiconductor layer structure;
a drain contact on the semiconductor layer structure;
a gate contact on the semiconductor layer structure between the source contact and the drain contact;
a multi-layer passivation structure on the semiconductor layer structure between the source contact and the drain contact, the multi-layer passivation structure including a plurality of layers that include at least a first silicon nitride layer and a second silicon nitride layer that has a material composition that is different than a material composition of the first silicon nitride layer; and
a spacer passivation layer on sidewalls of both the first silicon nitride layer and the second silicon nitride layer,
wherein a material composition of the spacer passivation layer is different than a material composition of at least one of the layers of the multi-layer passivation structure,
wherein a bottom surface of the spacer passivation layer is coplanar with a bottom surface of the gate contact,
wherein a quiescent drain current of the high electron mobility transistor is within 10 percent of a peak drain current of the high electron mobility transistor.

9. A high electron mobility transistor, comprising:
a semiconductor layer structure that includes a channel layer and a barrier layer on the channel layer;
a source contact on the semiconductor layer structure;
a drain contact on the semiconductor layer structure;
a gate contact on and directly contacting the semiconductor layer structure between the source contact and the drain contact;
a passivation structure on the semiconductor layer structure between the source contact and the drain contact; and
a spacer passivation layer on a sidewall of the passivation layer, where an outer side of the spacer passivation layer that is opposite the passivation layer has a concave profile.

10. The high electron mobility transistor of claim 9, wherein the passivation structure comprises a multi-layer passivation structure that includes at least a first silicon nitride layer that directly contacts the barrier layer and a second silicon nitride layer that is on the first silicon nitride layer opposite the barrier layer, where the second silicon nitride layer has a material composition that is different than a material composition of the first silicon nitride layer.

11. The high electron mobility transistor of claim 10, wherein the second silicon nitride layer is more silicon-rich than the first silicon nitride layer.

12. The high electron mobility transistor of claim 11, wherein the multi-layer passivation structure further comprises a third silicon nitride layer on the second silicon nitride layer opposite the first silicon nitride layer, where the third silicon nitride layer is more silicon- rich than the first silicon nitride layer.

13. The high electron mobility transistor of claim 12, wherein the spacer passivation layer directly contacts sidewalls of all three of the first through third silicon nitride layers.

14. The high electron mobility transistor of claim 12, wherein the spacer passivation layer comprises a fourth silicon nitride layer and a fifth silicon nitride layer that is between the fourth silicon nitride layer and the multi-layer passivation structure, wherein the fourth silicon nitride layer and the fifth silicon nitride layer are each more silicon- rich than all three of the first silicon nitride layer, the second silicon nitride layer, and the third silicon nitride layer, and wherein the fifth silicon nitride layer is an L-shaped layer that directly contacts a sidewall of the multi-layer passivation structure.

15. A high electron mobility transistor, comprising:
a semiconductor layer structure that includes a channel layer and a barrier layer on the channel layer;
a source contact on the semiconductor layer structure;
a drain contact on the semiconductor layer structure;
a gate contact on the semiconductor layer structure between the source contact and the drain contact;
a multi-layer passivation structure on the semiconductor layer structure between the source contact and the drain contact, the multi-layer passivation structure comprising a first silicon nitride layer that directly contacts the semiconductor layer structure; and
a silicon nitride spacer passivation layer that includes at least one silicon nitride layer on a sidewall of the multi-layer passivation structure, wherein a silicon concentration of the at least one silicon nitride layer exceeds a silicon concentration of the first silicon nitride layer.

16. The high electron mobility transistor of claim 15, wherein the multi-layer passivation structure further comprises a second silicon nitride layer that is on the first silicon nitride layer opposite the barrier layer, where the second silicon nitride layer is more silicon-rich than the first silicon nitride layer.

17. The high electron mobility transistor of claim 15, wherein an outer side of the spacer passivation layer that is opposite the multi-layer passivation structure has a concave profile.

18. The high electron mobility transistor of claim 16, wherein the multi-layer passivation structure further comprises a third silicon nitride layer on the second silicon nitride layer opposite the first silicon nitride layer, where the third silicon nitride layer is more silicon-rich than the first silicon nitride layer.

19. The high electron mobility transistor of claim 18, wherein the spacer passivation layer comprises a silicon-rich silicon nitride layer that is more silicon-rich than all three of the first silicon nitride layer, the second silicon nitride layer, and the third silicon nitride layer.

20. The high electron mobility transistor of claim 19, wherein the spacer passivation layer directly contacts sidewalls of all three of the first through third silicon nitride layers.

* * * * *

UNITED STATES PATENT AND TRADEMARK OFFICE
CERTIFICATE OF CORRECTION

Page 1 of 1

PATENT NO. : 12,464,759 B2
APPLICATION NO. : 17/890453
DATED : November 4, 2025
INVENTOR(S) : Bothe et al.

It is certified that error appears in the above-identified patent and that said Letters Patent is hereby corrected as shown below:

In the Specification

Column 7, Line 5: Please correct "IDS" to read --$I_{DS}$--

Column 7, Line 16: Please correct "IG" to read --$I_G$--

Column 7, Line 16: Please correct "ID" to read --$I_D$--

Column 10, Line 16: Please correct "AN," to read --AlN,--

Column 11, Line 46: Please correct "IG" to read --$I_G$--

Column 11, Line 47: Please correct "ID" to read --$I_D$--

In the Claims

Column 24, Line 17, Claim 12: Please correct "silicon- rich" to read --silicon-rich--

Column 24, Line 28, Claim 14: Please correct "silicon- rich" to read --silicon-rich--

Signed and Sealed this
Tenth Day of February, 2026

John A. Squires
*Director of the United States Patent and Trademark Office*